United States Patent
Li et al.

(10) Patent No.: US 12,457,852 B2
(45) Date of Patent: Oct. 28, 2025

(54) DISPLAY SUBSTRATE, METHOD FOR MANUFACTURING THEREOF AND DISPLAY APPARATUS

(71) Applicants: MIANYANG BOE OPTOELECTRONICS TECHNOLOGY CO., Ltd., Sichuan (CN); BOE Technology Group Co., Ltd., Beijing (CN)

(72) Inventors: Dali Li, Beijing (CN); Zerui Zhang, Beijing (CN); Yong Hu, Beijing (CN); Zifeng Wang, Beijing (CN); Hyoungseok Park, Beijing (CN)

(73) Assignees: MIANYANG BOE OPTOELECTRONICS TECHNOLOGY CO., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 12 days.

(21) Appl. No.: 17/756,329

(22) PCT Filed: Mar. 15, 2021

(86) PCT No.: PCT/CN2021/080752
§ 371 (c)(1),
(2) Date: May 23, 2022

(87) PCT Pub. No.: WO2022/193058
PCT Pub. Date: Sep. 22, 2022

(65) Prior Publication Data
US 2024/0172528 A1    May 23, 2024

(51) Int. Cl.
*H10K 59/121*    (2023.01)
*H10K 59/12*    (2023.01)
(Continued)

(52) U.S. Cl.
CPC ....... *H10K 59/121* (2023.02); *H10K 59/1201* (2023.02); *H10K 59/40* (2023.02);
(Continued)

(58) Field of Classification Search
CPC .. H10K 59/873; H10K 59/1201; H10K 59/40; H10K 59/65; H10K 2102/351;
(Continued)

(56) References Cited

U.S. PATENT DOCUMENTS

2019/0179466 A1* 6/2019 Kim ................ H10K 59/35
2019/0181373 A1  6/2019 Kim
(Continued)

FOREIGN PATENT DOCUMENTS

| CN | 106990864 A | 7/2017 |
| CN | 107808896 A | 3/2018 |

(Continued)

OTHER PUBLICATIONS

Chinese Office Action, mailed Mar. 16, 2023, from Chinese Patent Application No. 202180000491.8.

*Primary Examiner* — Eliseo Ramos Feliciano
*Assistant Examiner* — Timothy Edward Duren
(74) *Attorney, Agent, or Firm* — Workman Nydegger

(57) ABSTRACT

The present disclosure provides a display substrate, a method for manufacturing thereof and a display apparatus. The display substrate includes: a base substrate having a holing area, a display area around the holing area and an isolation area between the display area and the holing area; at least one circle of blocking wall in the isolation area and around the holing area; an encapsulation layer, on one side of a layer where the blocking wall is located away from the base substrate; a first protection layer, on one side of the encapsulation layer away from the base substrate; and a filling layer, on one side of the first protection layer away (Continued)

from the base substrate, in the isolation area, completely covering the at least one circle of blocking wall and at least partially overlapping with the encapsulation layer.

20 Claims, 20 Drawing Sheets

(51) Int. Cl.
  *H10K 59/40* (2023.01)
  *H10K 59/80* (2023.01)
  *H10K 102/00* (2023.01)
  H10K 59/65 (2023.01)

(52) U.S. Cl.
  CPC ....... *H10K 59/873* (2023.02); *H10K 59/8731* (2023.02); *H10K 59/65* (2023.02); *H10K 59/80* (2023.02); *H10K 59/875* (2023.02); *H10K 2102/351* (2023.02)

(58) Field of Classification Search
  CPC .. H10K 59/80; H10K 59/875; H10K 59/8731; H10K 71/231; H10K 77/10; H10K 59/121; H01L 27/1218; G09G 3/3208; G09G 3/3233; G09G 3/32
  See application file for complete search history.

(56) References Cited

U.S. PATENT DOCUMENTS

| | | |
|---|---|---|
| 2019/0355929 A1 | 11/2019 | Xu |
| 2020/0235333 A1 | 7/2020 | Sung et al. |
| 2020/0303677 A1 | 9/2020 | Lee et al. |
| 2020/0411629 A1 | 12/2020 | Kim et al. |
| 2021/0028249 A1 | 1/2021 | Ding et al. |
| 2021/0408150 A1 | 12/2021 | Zhang et al. |
| 2022/0020946 A1 | 1/2022 | Zhang et al. |
| 2022/0029137 A1* | 1/2022 | Ko ........................ G06F 3/0445 |
| 2022/0077438 A1* | 3/2022 | Wang ..................... H10K 77/10 |
| 2022/0130937 A1 | 4/2022 | Zhao et al. |
| 2022/0199952 A1* | 6/2022 | Jang ..................... H10K 59/131 |

FOREIGN PATENT DOCUMENTS

| | | |
|---|---|---|
| CN | 110021635 A | 7/2019 |
| CN | 110265583 A | 9/2019 |
| CN | 110854304 A | 2/2020 |
| CN | 111162195 A | 5/2020 |
| CN | 210516729 U | 5/2020 |
| CN | 111244112 A | 6/2020 |
| CN | 111384069 A | 7/2020 |
| CN | 111463236 A | 7/2020 |
| CN | 111525044 A | 8/2020 |
| CN | 111725257 A | 9/2020 |
| CN | 111740028 A | 10/2020 |
| CN | 111900260 A | 11/2020 |
| CN | 112271199 A | 1/2021 |
| CN | 112349867 A | 2/2021 |
| EP | 3276463 A1 | 1/2018 |
| JP | 2022096631 A * | 6/2022 ........... G09G 3/3225 |

* cited by examiner

DISPLAY SUBSTRATE, METHOD FOR MANUFACTURING THEREOF AND DISPLAY APPARATUS

The present application is a National Stage of International Application No. PCT/CN2021/080752, filed on Mar. 15, 2021, the entire contents of which are incorporated herein by reference.

FIELD

The present disclosure relates to the field of display technology, in particular to a display substrate, a method for manufacturing thereof and a display apparatus.

BACKGROUND

In recent years, a display screen is developing in a trend to a large screen and a full screen. In order to increase a screen-to-body ratio, a solution is to form a hole (AA hole) in a display area. For example, a position may be reserved for a function module (for example, a camera module) by forming the hole in the display area, and the function module is combined with the display area of the display screen so as to obtain maximization of the display area.

SUMMARY

Embodiments of the present disclosure provide a display substrate, a method for manufacturing thereof and a display apparatus. A specific solution is as follows.

In an aspect, an embodiment of the present disclosure provides a display substrate, including: a base substrate, including a holing area, a display area around the holing area, and an isolation area between the display area and the holing area, wherein the holing area is configured to install a light extraction component; at least one circle of blocking wall, in the isolation area and around the holing area; an encapsulation layer, on one side of a layer where the blocking wall is located away from the base substrate, wherein an orthographic projection of the encapsulation layer on the base substrate completely covers the display area; a first protection layer, on one side of the encapsulation layer away from the base substrate and at least completely covering the at least one circle of blocking wall; and a filling layer, on one side of the first protection layer away from the base substrate, in the isolation area, completely covering the at least one circle of blocking wall and at least partially overlapping with the encapsulation layer.

In some embodiments, in the above display substrate provided by the embodiment of the present disclosure, the encapsulation layer includes an organic encapsulation layer, the organic encapsulation layer includes a first organic encapsulation portion in the display area and a second organic encapsulation portion in the isolation area, a thickness h of the first organic encapsulation portion in a direction perpendicular to the base substrate meets the following formula: h=0.017x+4.5, in a condition that x≤441 microns; h=12 microns, in a condition that x>441 microns, wherein x is a distance between a measured position and a reference point, and the reference point is a point of one side, closest to the display area, of the at least one circle of blocking wall; and the second organic encapsulation portion is completely covered with the filling layer, a thickness of the second organic encapsulation portion in the direction perpendicular to the base substrate is gradually reduced in a direction from one side close to the display area, of the second organic encapsulation portion to another side, away from the display area, of the second organic encapsulation portion.

In some embodiments, in the above display substrate provided by the embodiment of the present disclosure, the at least one circle of blocking wall includes a first blocking wall away from the display area and a second blocking wall close to the display area, the second organic encapsulation portion covers the second blocking wall, a maximum width of the second blocking wall in a direction from one side, close to the display area, of the second blocking wall, to another side, away from the display area, of the second blocking wall is A, and a maximum width of a covering portion, covering the second blocking wall, of the second organic encapsulation portion in the direction from one side, close to the display area, of the second blocking wall, to another side, away from the display area, of the second blocking wall is B, wherein B≤0.85 A.

In some embodiments, in the above display substrate provided by the embodiment of the present disclosure, a segment a thickness of which does not change exists on a portion of the filling layer covering the second blocking wall, and a thickness of the segment the thickness of which does not change in the direction perpendicular to the base substrate is C.

In some embodiments, in the above display substrate provided by the embodiment of the present disclosure, the thickness of the filling layer is gradually increased to D in the direction from one side, close to the display area, of the second blocking wall, to another side, away from the display area, of the second blocking wall starting from the segment the thickness of which does not change, and a ratio of D to C is in a range from 2.5 to 3.

In some embodiments, the above display substrate provided by the embodiment of the present disclosure further includes: a second protection layer on one side of the filling layer away from the base substrate, wherein the second protection layer at least completely covers the filling layer, and the second protection layer on the filling layer is gradually inclined to a side of the base substrate in a direction from one side of the second protection layer close to the display area to another side of the second protection layer away from the display area.

In some embodiments, in the above display substrate provided by the embodiment of the present disclosure, a slope of the second protection layer is in a range of 0.01 to 0.02.

In some embodiments, in the above display substrate provided by the embodiment of the present disclosure, the first protection layer further includes a film layer which at least partially covers the display area, and is provided with a first opening corresponding to the holing area.

In some embodiments, in the above display substrate provided by the embodiment of the present disclosure, the second protection layer further includes a film layer which at least covers a part of the display area, and is provided with a second opening corresponding to the holing area.

In some embodiments, in the above display substrate provided by the embodiment of the present disclosure, the first opening coincides with the second opening.

In some embodiments, in the above display substrate provided by the embodiment of the present disclosure, the first protection layer and the second protection layer make direct contact with each other at least in the display area.

In some embodiments, in the above display substrate provided by the embodiment of the present disclosure, the first protection layer and the second protection layer further make direct contact with each other in the isolation area adjacent to the display area.

In some embodiments, in the above display substrate provided by the embodiment of the present disclosure, a material of the second protection layer is the same as a material of the first protection layer.

In some embodiments, in the above display substrate provided by the embodiment of the present disclosure, a thickness of the second protection layer is larger than 600 μm in a direction perpendicular to the base substrate.

In some embodiments, in the above display substrate provided by the embodiment of the present disclosure, the encapsulation layer includes a first inorganic encapsulation layer between the organic encapsulation layer and the at least one circle of blocking wall, and a second inorganic encapsulation layer between the organic encapsulation layer and the first protection layer, wherein an orthographic projection of the first inorganic encapsulation layer on the base substrate substantially coincides with an orthographic projection of the second inorganic encapsulation layer on the base substrate, and the second inorganic encapsulation layer wraps the organic encapsulation layer.

In some embodiments, in the above display substrate provided by the embodiment of the present disclosure, the second inorganic encapsulation layer makes direct contact with the first protection layer at least in the isolation area.

In some embodiments, in the above display substrate provided by the embodiment of the present disclosure, the second inorganic encapsulation layer further includes a film layer which at least covers a part of the display area, and is provided with a third opening corresponding to the holing area.

In some embodiments, in the above display substrate provided by the embodiment of the present disclosure, the first opening coincides with the third opening.

In some embodiments, in the above display substrate provided by the embodiment of the present disclosure, the filling layer is provided with a fourth opening corresponding to the holing area.

In some embodiments, in the above display substrate provided by the embodiment of the present disclosure, the first opening coincides with the fourth opening.

In some embodiments, in the above display substrate provided by the embodiment of the present disclosure, a distance from the first blocking wall to the display area is smaller than a distance from the first blocking wall to the holing area.

In some embodiments, the above display substrate provided by the embodiment of the present disclosure further includes a light-emitting function layer between a layer where the blocking wall is located and the first inorganic encapsulation layer, wherein the light-emitting function layer is provided with an opening corresponding to the holing area.

In some embodiments, the above display substrate provided by the embodiment of the present disclosure further includes: an isolation layer between the base substrate and a layer where the at least one circle of blocking wall is located, and the isolation layer includes at least one circle of first isolation structure and/or at least one circle of second isolation structure, wherein the at least one circle of first isolation structure is in a portion of the isolation area between the at least one circle of blocking wall and the holing area, and the at least one circle of second isolation structure is in another portion of the isolation area between the at least one circle of blocking wall and the display area;

and in the portion of the isolation area between the at least one circle of blocking wall and the holing area, a portion of the light-emitting function layer at the first isolation structure is disconnected from another portion of the light-emitting function layer between first isolation structures; and in the another portion of the isolation area between the at least one circle of blocking wall and the display area, a portion of the light-emitting function layer at the second isolation structure is disconnected from another portion of the light-emitting function layer between second isolation structures.

In some embodiments, in the above display substrate provided by the embodiment of the present disclosure, in the portion of the isolation area between the at least one circle of blocking wall and the holing area, the first protection layer is provided with an opening at the first isolation structure or between the first isolation structures; and in the another portion of the isolation area between the at least one circle blocking wall and the display area, the first inorganic encapsulation layer is provided with an opening at the second isolation structure or between the second isolation structures.

In some embodiments, in the above display substrate provided by the embodiment of the present disclosure, the isolation layer is a first inorganic insulation layer, the first isolation structure is a first isolation groove, and the second isolation structure is a second isolation groove; and the first protection layer is provided with an opening in a position corresponding to the first isolation groove, and the first inorganic encapsulation layer is provided with an opening in a position corresponding to the second isolation groove.

In some embodiments, in the above display substrate provided by the embodiment of the present disclosure, the isolation layer is a source-drain metal layer, the first isolation structure is a first isolation pillar, and the second isolation structure is a second isolation pillar;

and the first protection layer makes direct contact with the second inorganic encapsulation layer at the first isolation pillar, the first protection layer is provided with an opening between first isolation pillars, and the first inorganic encapsulation layer is provided with an opening between second isolation pillars.

In some embodiments, in the above display substrate provided by the embodiment of the present disclosure, the source-drain metal layer includes a first metal layer, a second metal layer and a third metal layer arranged in stack; and the first isolation pillar and the second isolation pillar both include: a first isolation part on the first metal layer, a second isolation part on the second metal layer, and a third isolation part on the third metal layer, wherein an orthographic projection of the first isolation part on the base substrate is larger than an orthographic projection of the second isolation part on the base substrate and substantially equal to an orthographic projection of the third isolation part on the base substrate.

In some embodiments, the above display substrate provided by the embodiment of the present disclosure includes a bridging layer on one side of the second protection layer away from the base substrate, the bridging layer includes a floating electrode, and an orthographic projection of the floating electrode on the base substrate covers at least a part of an orthographic projection of the second isolation structure on the base substrate.

In some embodiments, in the above display substrate provided by the embodiment of the present disclosure, the floating electrode is provided with a closed-loop shape, and an orthographic projection of the floating electrode on the base substrate completely covers an orthographic projection of the at least one circle of second isolation structure on the base substrate.

In some embodiments, the above display substrate provided by the embodiment of the present disclosure further includes: an etching blocking layer on one side of the base substrate facing the at least one circle of blocking wall, wherein the etching blocking layer makes direct contact with the base substrate; and the materials of the first protection layer and the second protection layer are the same as a material of the etching blocking layer.

In some embodiments, in the above display substrate provided by the embodiment of the present disclosure, a distance between a surface of the filling layer away from the base substrate and the base substrate is larger than a distance between a surface of the encapsulation layer away from the base substrate and the base substrate.

In some embodiments, the above display substrate provided by the embodiment of the present disclosure further includes: a second inorganic insulation layer and a touch electrode layer which are sequentially on one side of the bridging layer away from the base substrate, wherein the bridging layer further includes a plurality of bridging electrodes in the display area;

and the touch electrode layer includes, in the display area, a plurality of first touch electrodes extending in a first direction and a plurality of second touch electrodes extending in a second direction, the plurality of second touch electrodes or the plurality of first touch electrodes are electrically connected to the plurality of bridging electrodes through an opening penetrating through the second inorganic insulation layer, and the first direction intersects the second direction.

In some embodiments, the above display substrate provided by the embodiment of the present disclosure further includes: a third protection layer on one side of the touch electrode layer away from the base substrate, and the third protection layer is in the display area and the isolation area.

Based on the same inventive concept, an embodiment of the present disclosure provides a display apparatus, including the above display substrate and the light extraction component, wherein the light extraction component is installed in the holing area of the display substrate.

Based on the same inventive concept, an embodiment of the present disclosure provides a method for manufacturing the above display substrate, including: providing the base substrate, wherein the base substrate includes the holing area, the display area around the holing area, and the isolation area between the display area and the holing area, and the holing area is configured to install the light extraction component; forming at least one circle of blocking wall on the base substrate, wherein the at least one circle of blocking wall in the isolation area is around the holing area; forming the encapsulation layer on the layer where the at least one circle of blocking wall is located, wherein the orthographic projection of the encapsulation layer on the base substrate completely covers the display area; forming the first protection layer on the encapsulation layer, wherein the first protection layer at least completely covers the at least one circle of blocking wall; and forming the filling layer on the first protection layer, wherein the filling layer is in the isolation area, completely covers the at least one circle of blocking wall and at least partially overlaps with the encapsulation layer.

In some embodiments, the above method provided by the embodiment of the present disclosure, further includes: while forming the at least one circle of blocking wall on the base substrate, forming at least one circle of blocking dam in the holing area.

In some embodiments, in the above method provided by the embodiment of the present disclosure, the forming the encapsulation layer on the layer where the at least one circle of blocking wall is located, includes: forming a first inorganic encapsulation layer, an organic encapsulation layer and a second inorganic encapsulation layer sequentially on the layer where the at least one circle of blocking wall is located, wherein the first inorganic encapsulation layer is provided with an opening at least in a portion of the isolation area between the at least one circle of blocking wall and the display area, and the second inorganic encapsulation layer is provided with an opening in another portion of the isolation area between the at least one circle of blocking wall and the holing area; and forming a reinforced pad in the holing area while forming the organic encapsulation layer, wherein the reinforced pad is on one side of the at least one circle of blocking dam away from the isolation area.

In some embodiments, in the above method provided by the embodiment of the present disclosure, the forming the first protection layer on the encapsulation layer includes: forming an inorganic material layer on a whole surface of the encapsulation layer; and forming the first protection layer by patterning the inorganic material layer, wherein the first protection layer is provided with an opening only in the isolation area, and in the isolation area, the opening of the first protection layer communicates with the opening of the second inorganic encapsulation layer.

In some embodiments, the above method provided by the embodiment of the present disclosure, after forming the filling layer on the first protection layer, further includes: forming a second protection layer arranged in a whole surface on the filling layer.

In some embodiments, the above method provided by the embodiment of the present disclosure, after forming the second protection layer arranged in a whole surface on the filling layer, further includes: forming a through hole penetrating through the display substrate in the holing area by removing all film layers in the holing area in laser cutting, wherein all the film layers in the holing area at least include the base substrate, the at least one circle of blocking dam, a light-emitting function layer, the second inorganic encapsulation layer, the reinforced pad, the first protection layer, the filling layer and the second protection layer.

DETAILED DESCRIPTION OF THE EMBODIMENTS

Figure 1:
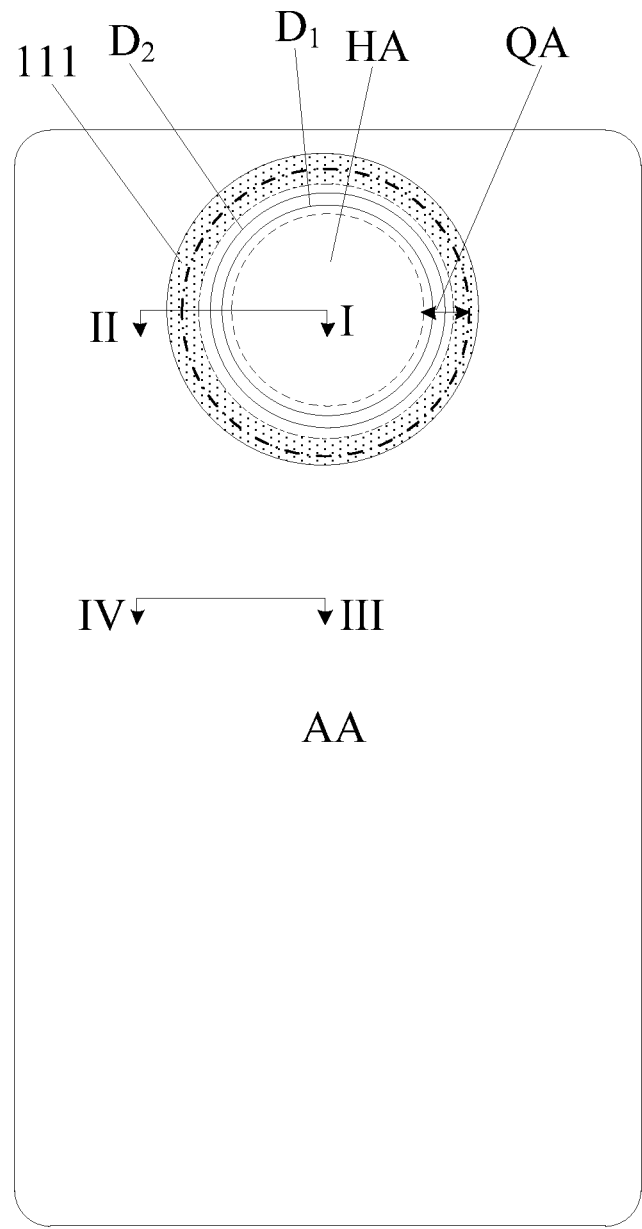
FIG. 1 is a schematic structural diagram of a display substrate provided by an embodiment of the present disclosure.

In order to make objectives, technical solutions and advantages of embodiments of the present disclosure clearer, the technical solutions of the embodiments of the present disclosure will be described completely and clearly below with reference to the accompanying drawings of the embodiments of the present disclosure. It needs to be noted that a size and a shape of each figure in the drawings do not reflect a true scale and are only intended to illustrate contents of the present disclosure. The same or similar reference number represents the same or similar element or an element with the same or similar function all the time. Apparently, described embodiments are some, but not all, of embodiments of the present disclosure. Based on the described embodiments of the present disclosure, all other embodiments obtained by those ordinarily skilled in the art without creative work fall within the protection scope of the present disclosure.

Unless otherwise defined, technical or scientific terms used herein should be commonly understood by those ordinarily skilled in the art. "First", "second" and similar words used in the specification and claims of the present disclosure do not represent any sequence, quantity or significance but are only used for distinguishing different components. "Include", or "contain" or similar words means that an element or an item preceding the word covers an element or an item and its equivalents listed after the word without excluding other elements or items. "Inside", "outside", "up", "down" and the like are only used for representing a relative position relation, and when an absolute position of a described object changes, the relative position relation may also change correspondingly.

In the related art, compared with other display areas, a film layer in a holing area is weak, consequently, the holing area is poor in strength and is prone to cracking, so encapsulation fails, which leads to poor displaying and affects use by a user. Therefore, it is urgent to improve hole strength so as to improve a yield of a product adopting a display area holing technology.

A filling layer (e.g., organic B, OCB) is manufactured in the holing area so that damage caused by stress or external force on a holing position may be effectively relieved, and thus hole strength is improved. Usually after completing the filling layer, a flexible multi-layer on cell (FMLOC) process is performed, so manufacture of a touch function layer (e.g., touch screen panel, TSP) is realized. However, a reliability test detects that an occurrence rate of poor touch is 100%. The present disclosure discovers from an analysis that a manufacture process of the filling layer includes a wet process such as washing and developing, during this process, a water absorption amount of an organic layer manufactured in a former process is increased, and in a high temperature reliability test, water vapor evaporation from the organic layer leads to peeling of the touch function layer, so poor touch is caused.

In order to at least solve the above technical problems in the related art, an embodiment of the present disclosure provides a display substrate, which, as shown in FIG. 1 to FIG. 5, may include a base substrate 101, at least one circle of blocking wall 102, an encapsulation layer 103, a first protection layer 104 and a filling layer 105.

The base substrate 101 is provided with a holing area HA, a display area AA around the holing area HA, and an isolation area QA between the display area AA and the holing area HA, and the holing area HA is configured to install a light extraction component.

The at least one circle of blocking wall 102 in the isolation area QA is around the holing area HA.

The encapsulation layer 103 is on one side of a layer where blocking wall 102 is away from the base substrate 101, wherein an orthographic projection of the encapsulation layer 103 on the base substrate 101 completely covers the display area AA.

The first protection layer 104 is on one side of the encapsulation layer 103 away from the base substrate 101 and at least completely covers all the blocking walls 102. The material of the first protection layer 104 is silicon oxide, silicon nitride, silicon nitride oxide, or other water-blocking material. The first protection layer 104 may be a single layer structure or may include a plurality of sub-layers, e.g., 2, 3, 4, 5 or more sub-layers. The material of each of the plurality of sub-layers may be silicon oxide, silicon nitride, silicon nitride oxide, or other water-blocking material. The first protection layer prevents water vapor from invading the encapsulation layer 103.

The filling layer 105 is on one side of the first protection layer 104 away from the base substrate 101, is in the isolation area QA, completely covers the blocking wall 102 and at least partially overlaps with the encapsulation layer 103. In some embodiments, the filling layer 105 may adopt an organic material such as insulating cement (e.g., OCB).

In the above display substrate provided by the embodiment of the present disclosure, the first protection layer 104 is between the blocking wall 102 and the filling layer 105, and the first protection layer 104 completely covers an organic layer where the blocking wall 102 is located, so during manufacture of the filling layer 105, the blocking wall 102 is out of contact with water due to isolation by the first protection layer 104, thus poor touch caused by water absorption of the organic layer where the blocking wall 102 is located is eliminated.

Figure 2:
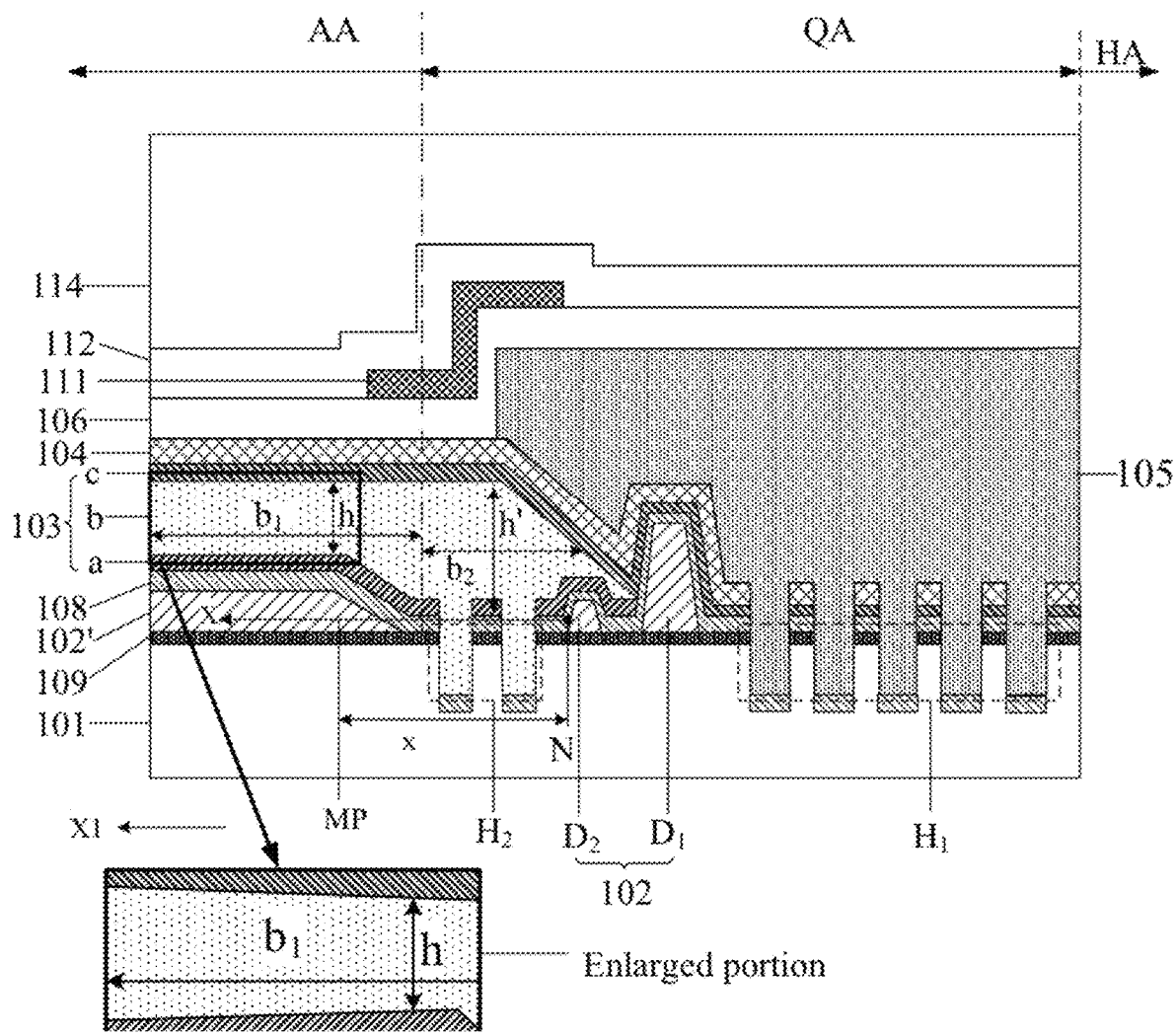
FIG. 2 is a schematic structural sectional view along a line I-II in FIG. 1.
Figure 6:
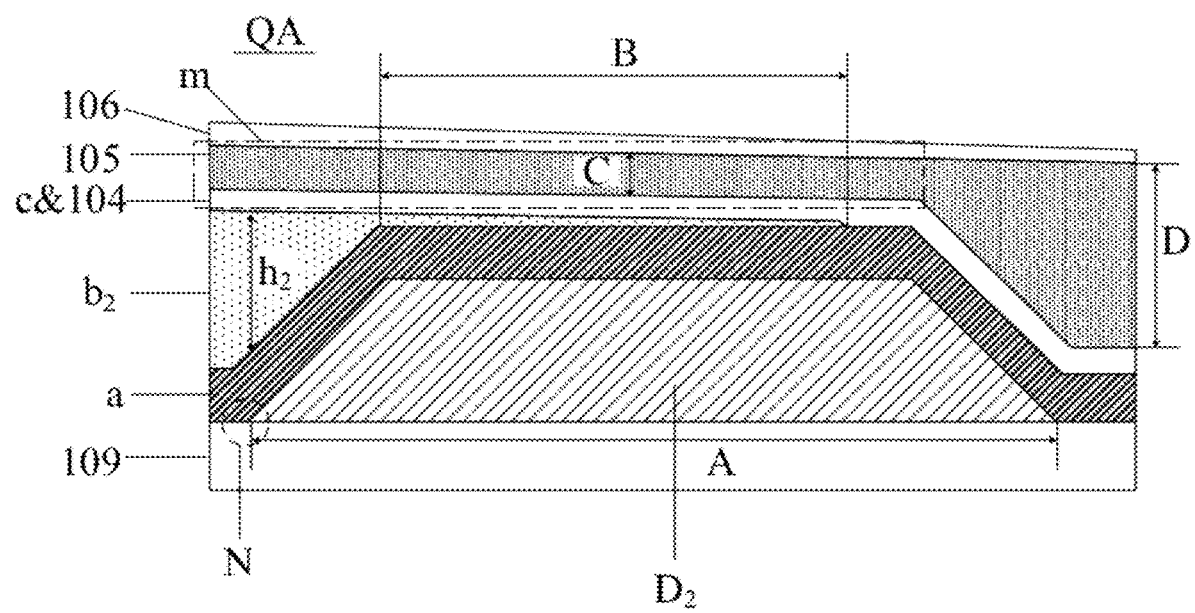
FIG. 6 is a schematic structural diagram of an area where a second blocking wall is located in a display substrate provided by an embodiment of the present disclosure.

In some embodiments, in the above display substrate provided by the embodiment of the present disclosure, in order to realize a good encapsulation on the display area AA, as shown in FIG. 2 and FIG. 6, the encapsulation layer 103 may include an organic encapsulation layer b. The organic encapsulation layer b includes a first organic encapsulation portion $b_1$ in the display area AA and a second organic encapsulation portion $b_2$ in the isolation area QA. A thickness h of the first organic encapsulation portion $b_1$ in a direction perpendicular to the base substrate 101 meets the following formula: $h=0.017x+4.5$, in the condition that $x \leq 441$ microns; and $h=12$ microns, in the condition that $x>441$ microns, wherein x is a distance between a measured position MP and a reference point N, the reference point N is a point of one side, closest to the display area AA, of the at least one circle of blocking wall 102. The measured position MP is on the connecting line from N to X, and the connecting line extends along a first direction X1. The second organic encapsulation portion $b_2$ is completely covered with the filling layer 105, and a thickness h' of the second organic encapsulation portion $b_2$ in the direction perpendicular to the base substrate is gradually reduced in a third direction from one side, close to the display area AA, of the second organic encapsulation portion $b_2$ to another side, away from the display area AA, of the second organic encapsulation portion $b_2$. In FIG. 2, an enlarged portion of the first organic encapsulation portion $b_1$ is illustrated.

In some embodiments, in the above display substrate provided by the embodiment of the present disclosure, in order to obtain a better encapsulation, as shown in FIG. 2 and FIG. 6, the at least one circle of blocking wall 102 may include a second blocking wall $D_2$ close to the display area AA and a first blocking wall $D_1$ away from the display area AA. The second organic encapsulation portion $b_2$ covers the second blocking wall $D_2$, a maximum width of the second blocking wall $D_2$ in a fourth direction from one side, close to the display area AA, of the second blocking wall $D_2$, to another side, away from the display area AA, of the second blocking wall $D_2$, is A, where A is in a range of 10 to 60 microns, e.g., 10, 20, 30, 35, 40, 50, 60 microns, or is in a range of 30 to 40 microns. A maximum width of a covering portion, covering the second blocking wall $D_2$, of the second organic encapsulation portion $b_2$ in the fourth direction away is B, wherein B≤0.85 A, and B is in a range of 8.5 to 51 microns, or is in a range of 25.5 to 34 microns.

In some embodiments, in the above display substrate provided by the embodiment of the present disclosure, in order to facilitate maintaining a shape of the holing area HA, as shown in FIG. 6, a segment m a thickness of which does not change exists on a portion of the filling layer 105 covering the second blocking wall $D_2$, and a thickness of the segment the thickness of which does not change in the direction perpendicular to the base substrate 101 is C, and C is in a range of 2 to 10 microns, e.g., 2, 3, 5, 8 . . . , 10 microns. The thickness of the filling layer 105 is gradually increased to D in the third direction starting from the segment m the thickness of which does not change, a ratio of D to C is in a range from 2.5 to 3, and D is in a range of 5 to 30 microns, e.g., 5, 8, 10, . . . , 30 microns.

In some embodiments, the above display substrate provided by the embodiment of the present disclosure, in order to avoid damage to the filling layer 105 by the subsequent manufacture of a film layer (such as a bridging layer), as shown in FIG. 2 and FIG. 6, may further include: a second protection layer 106 on one side of the filling layer 105 away from the base substrate 101. The second protection layer 106 at least completely covers the filling layer 105, and the second protection layer 106 on the filling layer 105 is gradually inclined to a side of the base substrate 101 in a direction from one side of the second protection layer 106 close to the display area AA to another side of the second protection layer 106 away from the display area AA. In some embodiments, a slope of the second protection layer 106 is in a range of 0.01 to 0.02. The material of the second protection layer 106 is silicon oxide, silicon nitride, silicon nitride oxide, or other water-blocking material. The second protection layer 106 may be a single layer structure or may include a plurality of sub-layers, e.g., 2, 3, 4, 5 or more sub-layers. The material of each of the plurality of sub-layers may be silicon oxide, silicon nitride, silicon nitride oxide, or other water-blocking material. The second protection layer also prevents water vapor from invading the encapsulation layer 103.

Besides, an inventor discovers that there are metal particles precipitated in a former process before forming the filling layer 105, an adhesion of the filling layer 105 to the metal particles is high, consequently, complete developing fails, resulting in residues of the filling layer 105. In a high temperature reliability test, the residual filling layer 105 is expanded, which may also lead to peeling of the touch function layer, and cause poor touch.

Based on this, in the above display substrate provided by the embodiment of the present disclosure, as shown in FIG. 2 to FIG. 5, the first protection layer 104 may further include a film layer which at least covers a part of the display area AA, and is provided with a first opening corresponding to the holing area HA (that is, a portion of the first protection layer 104 corresponding to the holing area HA is removed).

The first protection layer 104 at least covering a part of the display area AA separates the filling layer 105 from the metal particles on a lower film layer, so that a developing procedure of the filling layer 105 may be fully performed, thus the residuals of the filling layer 105 are avoided, and the problem of poor touch caused by expanding of the residuals of the filling layer 105 is solved. Besides, light transmittance of the holing area HA may be increased by means of the first opening of the first protection layer 104 in the holing area HA.

In some embodiments, in the above display substrate provided by the embodiment of the present disclosure, as shown in FIG. 2 to FIG. 5, the second protection layer 106 may further include a film layer which at least covers a part of the display area AA, and is provided with a second opening corresponding to the holing area HA (that is, a portion of the second protection layer 106 corresponding to the holing area HA is removed). The second protection layer 106 covers a part of or all of the display area AA so as to avoid damage to the encapsulation layer 103 by the subsequent manufacture of the film layer (such as the bridging layer). Besides, light transmittance of the holing area HA may be increased by means of the second opening of the second protection layer 106 in the holing area HA.

In some embodiments, the first opening of the first protection layer 104 in the holing area HA may coincide with the second opening of the second protection layer 106 in the holing area HA, so that light transmittance of the holing area HA may be increased.

In some embodiments, in the above display substrate provided by the embodiment of the present disclosure, as shown in FIG. 2 to FIG. 5, the first protection layer 104 and the second protection layer 106 make direct contact with each other at least in the display area AA. The first protection layer 104 and the second protection layer 106 arranged in this way may be used for carrying the touch function layer subsequently formed in the display area AA on the one hand, and may avoid the damage to the encapsulation layer 103 during forming of the touch function layer on the other hand, so that a good encapsulation is guaranteed.

In some embodiments, in the above display substrate provided by the embodiment of the present disclosure, as shown in FIG. 2 to FIG. 5, the first protection layer 104 and the second protection layer 106 may further make direct contact with each other in the isolation area adjacent to the display area AA. In this way, the first protection layer 104, the second protection layer 106 and the filling layer 105 may form a sandwich structure in the isolation area QA, and the sandwich structure forms a good wrapping on the filling layer 105 on one side adjacent to the display area AA.

In some embodiments, in the above display substrate provided by the embodiment of the present disclosure, in the direction perpendicular to the base substrate 101, the second protection layer 106 and the first protection layer 104 may be the same in thickness as well as in material, so that the first protection layer 104 and the second protection layer 106 may be manufactured respectively by using the same process parameter, and a manufacture process is simplified. Besides, in some embodiments, a thickness of the first protection layer 104 may be different from a thickness of the second protection layer 106, which may be flexibly set according to actual demands and is not limited herein.

In some embodiments, in the above display substrate provided by the embodiment of the present disclosure, in the direction perpendicular to the base substrate 101, the thickness of the second protection layer 106 may be larger than 600 μm. In the related art, during manufacture of the bridging layer (e.g., touch metal A, TMA), a maximum loss amount to the second protection layer 106 is 600 μm, so by setting the thickness of the second protection layer 106 to be larger than 600 μm, the filling layer 105 may be effectively prevented from being damaged. In some embodiments, a sum of the thickness of the first protection layer 104 and thickness of the second protection layer 106 may be about 2000 μm.

In some embodiments, in the above display substrate provided by the embodiment of the present disclosure, as shown in FIG. 2 to FIG. 5, in order to realize the good encapsulation on the display area AA, the encapsulation layer 103 may include a first inorganic encapsulation layer a between the organic encapsulation layer b and the at least one circle of blocking wall 102, and a second inorganic encapsulation layer c between the organic encapsulation layer b and the first protection layer 104. An orthographic projection of the first inorganic encapsulation layer a on the base substrate 101 substantially coincides with an orthographic projection of the second inorganic encapsulation layer c on the base substrate 101, and the second inorganic encapsulation layer c wraps the organic encapsulation layer b.

Figure 3:
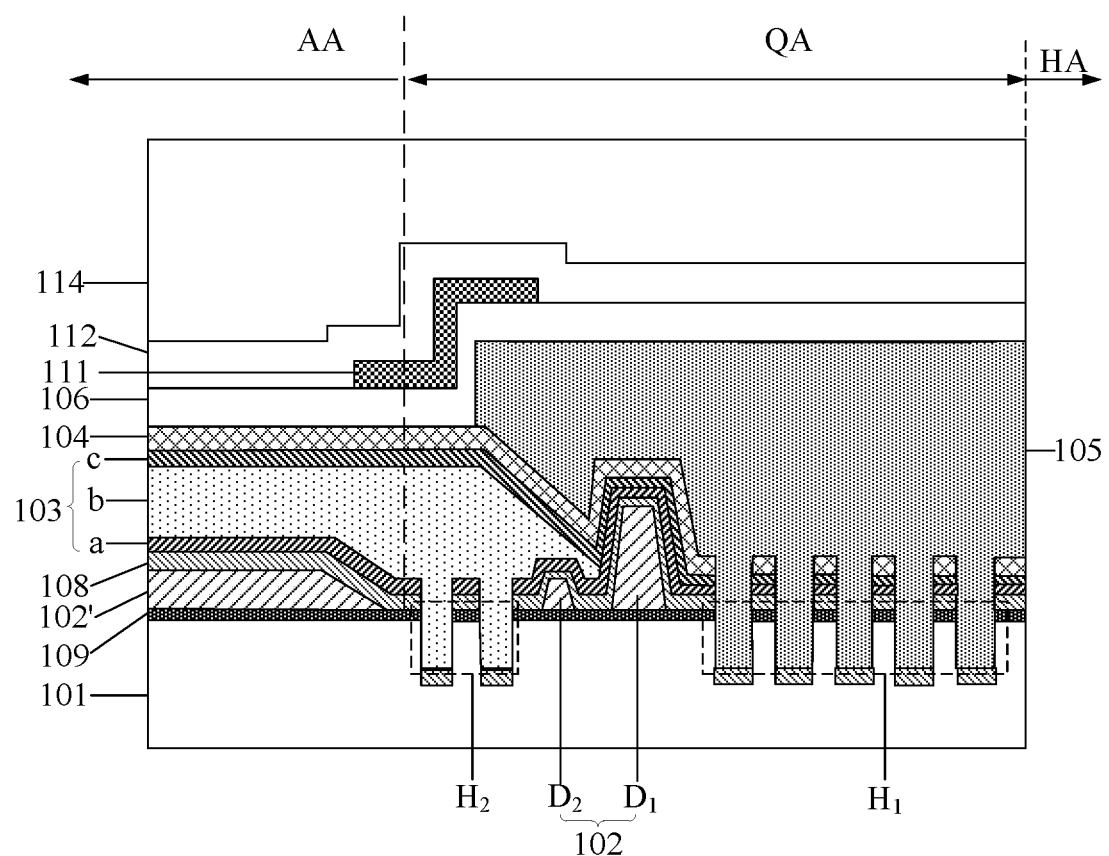
FIG. 3 is another schematic structural sectional view along a line I-II in FIG. 1.
Figure 4:
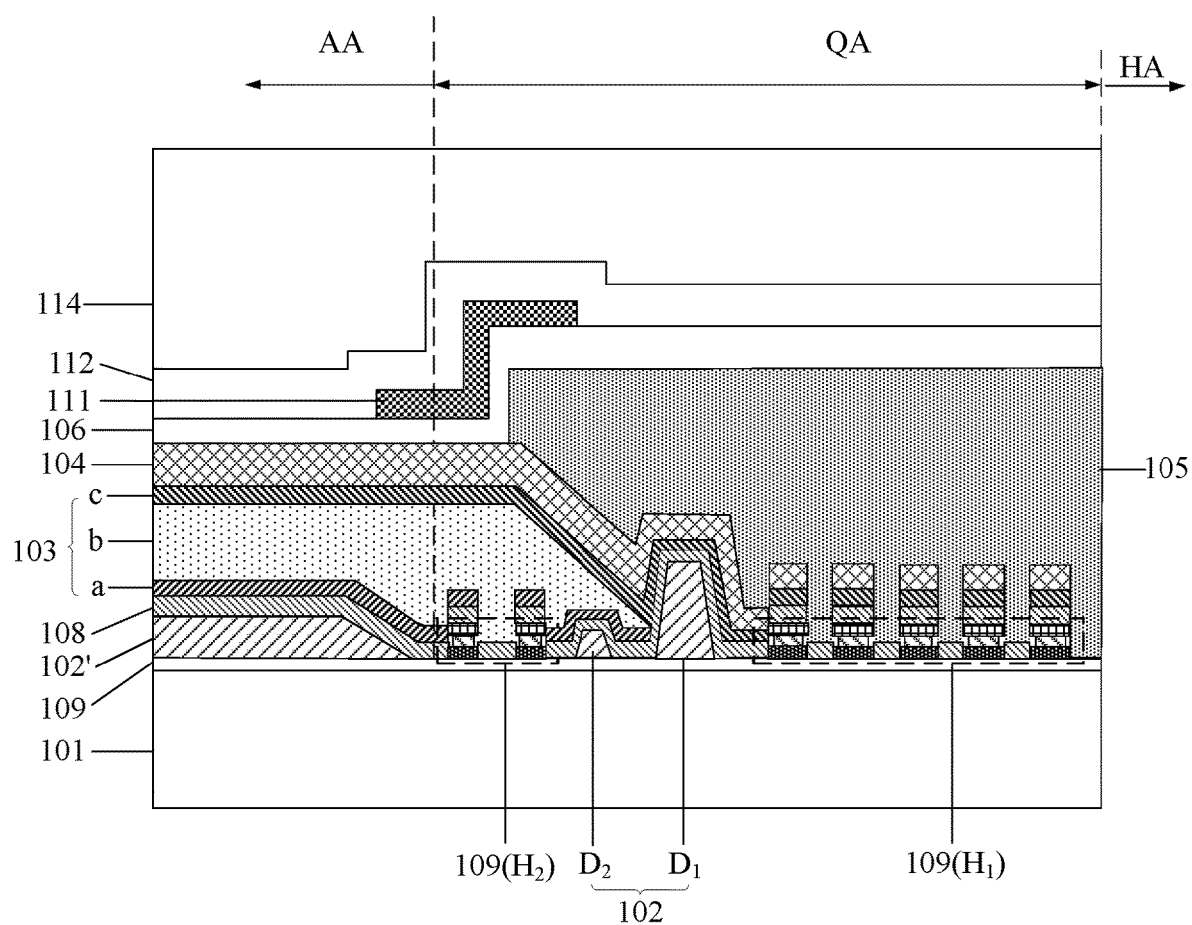
FIG. 4 is yet another schematic structural sectional view along a line I-II in FIG. 1.
Figure 7:
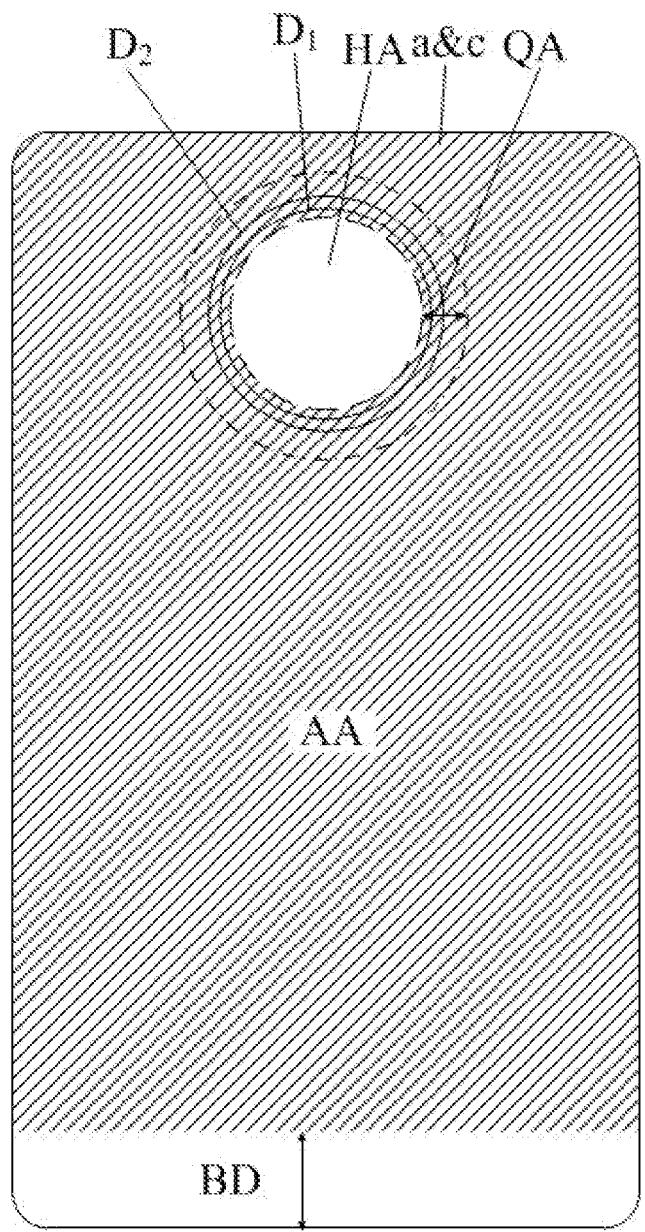
FIG. 7 is another schematic structural diagram of a display substrate provided by an embodiment of the present disclosure.
Figure 8:
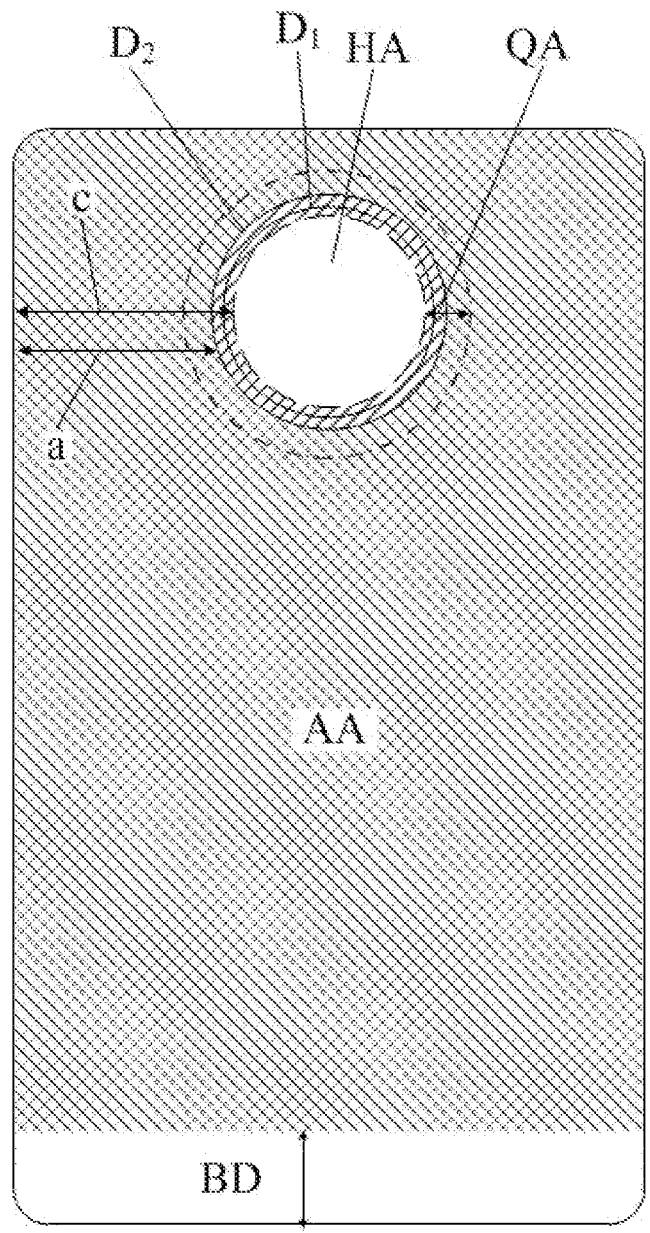
FIG. 8 is yet another schematic structural diagram of a display substrate provided by an embodiment of the present disclosure.

In some embodiments, as shown in FIG. 3, FIG. 7 and FIG. 8, the orthographic projection of the first inorganic encapsulation layer a on the base substrate 101 may completely coincide with the orthographic projection of the second inorganic encapsulation layer c on the base substrate 101. That is, the orthographic projections of both the first inorganic encapsulation layer a and the second inorganic encapsulation layer c on the base substrate 101 are in the display area AA and the isolation area QA; or the orthographic projection of the second inorganic encapsulation layer c on the base substrate 101 is slightly larger than the orthographic projection of the first inorganic encapsulation layer a on the base substrate 101. As shown in FIG. 2, FIG. 4 and FIG. 8, the orthographic projection of the second inorganic encapsulation layer c on the base substrate 101 is in the display area AA and the isolation area QA, and the orthographic projection of the first inorganic encapsulation layer a on the base substrate 101 is in the display area AA and a portion of the isolation area QA between the blocking wall 102 and the display area AA.

In some embodiments, in the above display substrate provided by the embodiment of the present disclosure, as shown in FIG. 2 to FIG. 5, the second inorganic encapsulation layer c and the first protection layer 104 make direct contact with each other at least in the isolation area QA. FIG. 2 to FIG. 5 show that the second inorganic encapsulation layer c is in direct contact with the first protection layer 104 in the display area AA and the isolation area QA. During subsequent forming of a touch function layer, the first protection layer 104 protects the encapsulation layer 103 against damage, so that the good encapsulation is guaranteed.

In some embodiments, in the above display substrate provided by the embodiment of the present disclosure, as shown in FIG. 2 to FIG. 7, the second inorganic encapsulation layer c may further include a film layer which at least covers a part of the display area AA, and is provided with a third opening corresponding to the holing area HA, so that light transmittance of the holing area HA is improved. In some embodiments, the first opening of the first protection layer 104 in the holing area HA coincides with the third opening of the second inorganic encapsulation layer c in the holing area HA, so that light transmittance of the holing area HA is increased.

In some embodiments, in the above display substrate provided by the embodiment of the present disclosure, in order to further increase light transmittance of the holing area HA, as shown in FIG. 2 to FIG. 5, the filling layer 105 is provided with a fourth opening corresponding to the holing area HA. In some embodiments, the first opening of the first protection layer 104 in the holing area HA may coincide with the fourth opening of the filling layer 105 in the holing area HA.

In some embodiments, in the above display substrate provided by the embodiment of the present disclosure, as shown in FIG. 1 to FIG. 7, the at least one circle of blocking wall 102 may include: a first blocking wall $D_1$ and a second blocking wall $D_2$ which are adjacent to the display area AA and are arranged in the isolation area QA in sequence. The first blocking wall $D_1$ and the second blocking wall $D_2$ may prevent the organic encapsulation layer b from passing the second blocking wall $D_2$, so that it is guaranteed that water vapor cannot extend to the display area AA along the organic encapsulation layer b. In some embodiments, the at least one circle of blocking wall 102 may only include the first blocking wall $D_1$.

In some embodiments, in the above display substrate provided by the embodiment of the present disclosure, as shown in FIG. 2 and FIG. 3, in order to effectively stop the organic encapsulation layer b from overflowing, a distance from the first blocking wall $D_1$ to the display area AA may be set to be smaller than a distance from the first blocking wall $D_1$ to the holing area HA.

In some embodiments, the above display substrate provided by the embodiment of the present disclosure, as shown in FIG. 2 to FIG. 5, may further include a light-emitting function layer 108 between the layer where the blocking wall 102 is located and the first inorganic encapsulation layer a. The light-emitting function layer 108 is provided with an opening corresponding to the holing area HA, so that light transmittance of the holing area HA is greatly improved, and an imaging effect is improved. In some embodiments, the light-emitting function layer 108 may include but is not limited to a hole injection layer, a hole transport layer, an electron blocking layer, a light-emitting material layer, a hole blocking layer, an electron transport layer and an electron injection layer.

In some embodiments, the above display substrate provided by the embodiment of the present disclosure, as shown in FIG. 2 to FIG. 5, may further include: an isolation layer 109 between the base substrate 101 and the layer where the blocking wall 102 is located, and the isolation layer 109 includes at least one circle of first isolation structure $H_1$ and/or at least one circle of second isolation structure $H_2$. All the first isolation structure $H_1$ is in a portion of the isolation area QA between the first blocking wall $D_1$ and the holing area HA, and all the second isolation structures H$_2$ are in another portion of the isolation area QA between the second blocking wall D$_2$ and the display area AA.

In the portion of the isolation area QA between the first blocking wall D$_1$ and the holing area HA, a portion of the light-emitting function layer 108 at the first isolation structure H1 is disconnected from another portion of the light-emitting function layer 108 between the first isolation structures H$_1$.

In the another portion of the isolation area QA between the second blocking wall D$_2$ and the display area AA, a portion of the light-emitting function layer 108 at the second isolation structure H$_2$ is disconnected from another portion of the light-emitting function layer 108 between the second isolation structures H$_2$.

As the first isolation structure H1 and the second isolation structure H2 may disconnect the light-emitting function layer 108, water vapor may be effectively prevented from entering the display area AA along the light-emitting function layer 108 so as not to affect the display.

In some embodiments, in the above display substrate provided by the embodiment of the present disclosure, as shown in FIG. 2 to FIG. 5, in the portion of the isolation area QA between the first blocking wall D$_1$ and the holing area HA, the first protection layer 104 is provided with an opening at the first isolation structure H$_1$ or between the first isolation structures H$_1$; and in the another portion of the isolation area QA between the second blocking wall D$_1$ and the display area AA, the first inorganic encapsulation layer a is provided with an opening at the second isolation structure H$_2$ or between the second isolation structures H$_2$. In some embodiments, as shown in FIG. 2 and FIG. 3, the isolation layer 109 may be a first inorganic insulation layer, the first isolation structure H$_1$ may be a first isolation groove, the second isolation structure H$_2$ may be a second isolation groove, the first protection layer 104 is provided with the opening at the first isolation groove (namely, the first isolation structure H$_1$), and the first inorganic encapsulation layer a is provided with the opening at the corresponding second isolation groove (namely, the second isolation structure H$_2$).

The first inorganic encapsulation layer a is provided with the opening at the second isolation groove (namely, the second isolation structure H$_2$) and makes direct contact with a portion of the light-emitting function layer 108 between the second isolation grooves (namely, the second isolation structures H$_2$).

The opening opposite to the first isolation groove (namely, the first isolation structure H$_1$) is provided in the first protection layer 104, so the filling layer 105 may be embedded into the first isolation groove (namely, the first isolation structure H$_1$) through the opening. Therefore, adhesion of the filling layer 105 is improved, and the strength of the holing area HA by the filling layer 105 is improved and stress borne by the holing area HA is relieved. By forming the opening, opposite to the second isolation groove (namely, the second isolation structure H$_2$) in the first inorganic encapsulation layer a, the organic encapsulation layer b may be embedded into the second isolation groove (namely, the second isolation structure H$_2$) through the opening, so adhesion of the organic encapsulation layer b is improved, and the encapsulation on the display area AA by the organic encapsulation layer b is guaranteed.

In some embodiments, the first isolation groove (namely, the first isolation structure H$_1$) and the second isolation groove (namely, the second isolation structure H$_2$) may be through holes penetrating through the first inorganic insulation layer (namely, the isolation layer 109), or may be blind holes not penetrating through the first inorganic insulation layer (namely, the isolation layer 109). FIG. 2 and FIG. 3 show structural diagrams of the first isolation groove (namely, the first isolation structure H$_1$) and the second isolation groove (namely, the second isolation structure H$_2$) being through holes penetrating through the first inorganic insulation layer (namely, the isolation layer 109). Besides, in order to better disconnect the light-emitting function layer 108, as shown in FIG. 2 and FIG. 3, a blind hole directly opposite the first isolation groove (namely, the first isolation structure H$_1$) and the second isolation groove (namely, the second isolation structure H$_2$) may be further provided in the base substrate 101 below the first inorganic insulation layer (namely, the isolation layer 109).

Figure 9:
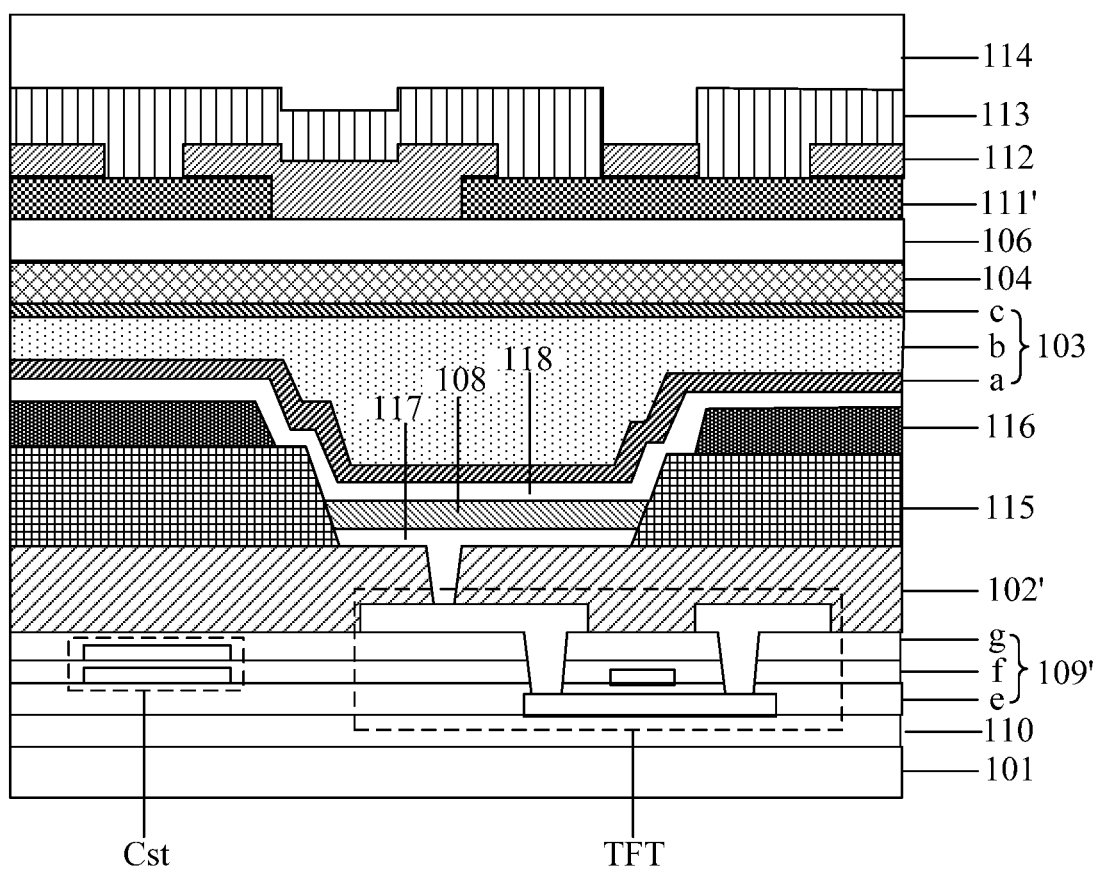
FIG. 9 is a schematic structural sectional view along a line III-IV in FIG. 1.

In some embodiments, as shown in FIG. 9, the first inorganic insulation layer 109'(namely, the isolation layer 109) may include: a gate insulation layer e between an active layer and a gate (arranged in the same layer as a first electrode of a storage capacitor) of a thin film transistor (TFT), a first interlayer dielectric layer f between the gate of the TFT and a second electrode of the storage capacitor Cst, and a second interlayer dielectric layer g between the second electrode of the storage capacitor Cst and a source/drain electrode of the TFT. In some other embodiments, the first inorganic insulation layer 109' may further include an etching blocking layer 110 making direct contact with the base substrate 101 besides the gate insulation layer e, the first interlayer dielectric layer f and the second interlayer dielectric layer g.

It needs to be noted that in the embodiment provided by the present disclosure, due to influence of limit of process conditions, or measurement and other factors, the above "substantially" may be "completely equivalent", or may have a certain deviation, so an "substantially" relation between the above features falls within the protection scope of the present disclosure as long as it meets an allowed error (for example, fluctuating between 10% above and 10% below).

Figure 5:
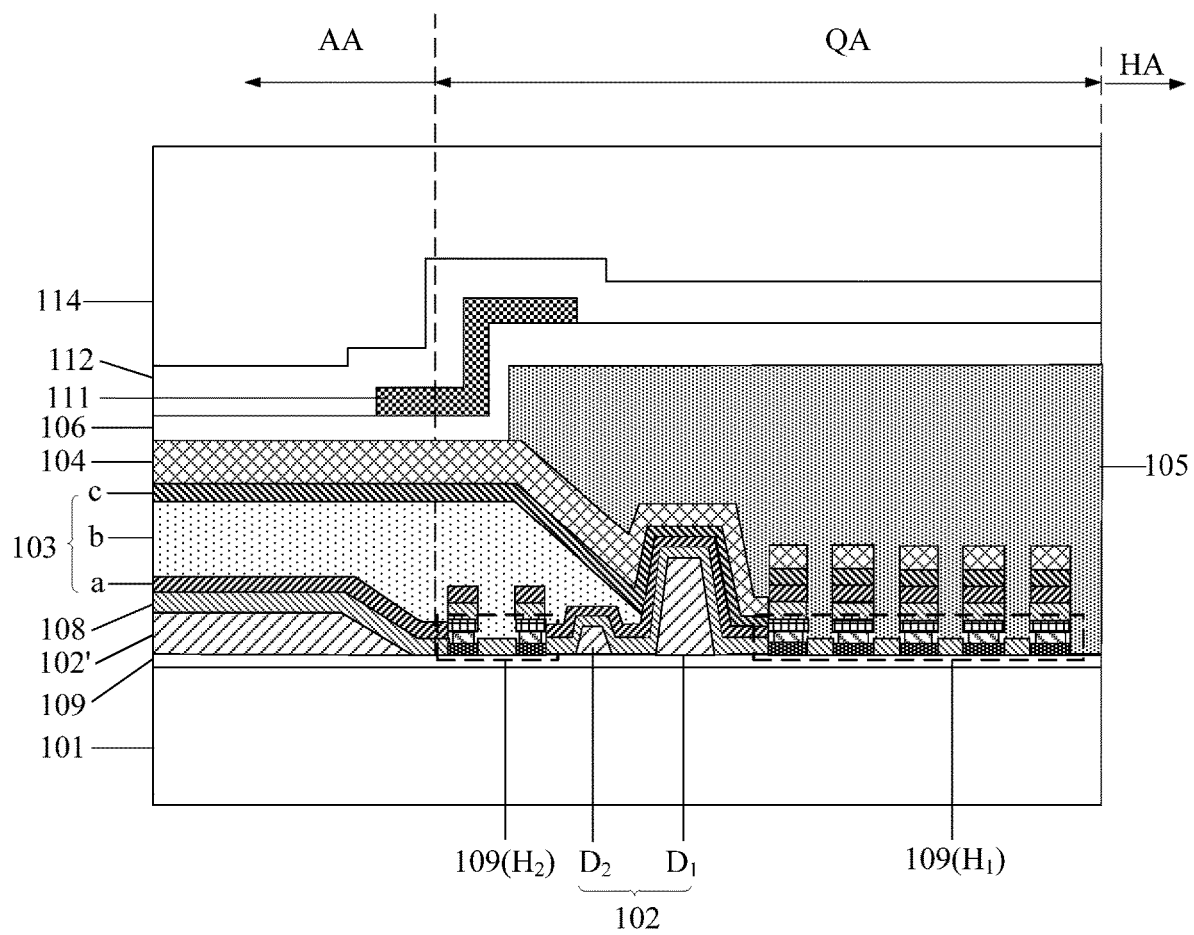
FIG. 5 is yet another schematic structural sectional view along a line I-II in FIG. 1.

In some embodiments, in the above display substrate provided by the embodiment of the present disclosure, as shown in FIG. 3 and FIG. 5, the isolation layer 109 may be a source-drain metal layer, the first isolation structure H$_1$ may be a first isolation pillar, and the second isolation structure H$_2$ may be a second isolation pillar.

The first protection layer 104 makes direct contact with the second inorganic encapsulation layer c at the first isolation pillar (namely, the first isolation structure H$_1$), the first protection layer 104 is provided with the opening between the first isolation pillars (namely, the first isolation structures H$_1$), and the first inorganic encapsulation layer b is provided with the opening between the second isolation pillars (namely, the second isolation structures H$_2$).

An area between the first isolation pillars (namely, the first isolation structures H$_1$) is equivalent to a groove, so the opening opposite to the groove is formed in the first protection layer 104. The filling layer 105 may be embedded into the groove between the first isolation pillars (namely, the first isolation structure H$_1$) through the opening, so adhesion of the filling layer 105 is improved, and the strength of the holing area HA by the filling layer 105 is improved and the stress borne by the holing area HA is relieved. By forming the opening opposite to the groove between the second isolation pillars (namely, the second isolation structures H$_2$) in the first inorganic encapsulation layer a, the organic encapsulation layer b may be embedded into the groove between the second isolation pillars (namely, the second isolation structures $H_2$) through the opening, so adhesion of the organic encapsulation layer b is improved, and the encapsulation on the display area AA by the organic encapsulation layer b is guaranteed. In some embodiments, the source-drain metal layer may include a first metal layer (for example, a titanium (Ti) metal layer), a second metal layer (for example, an aluminum (Al) metal layer) and a third metal layer (for example, a titanium (Ti) metal layer) arranged in stack. The first isolation pillar (namely, the first isolation structure $H_1$) and the second isolation pillar (namely, the second isolation structure $H_2$) may each include: a first isolation part on the first metal layer, a second isolation part on the second metal layer, and a third isolation part on the third metal layer. An orthographic projection of the first isolation part on the base substrate is larger than an orthographic projection of the second isolation part on the base substrate and substantially equal to an orthographic projection of a third isolation part on the base substrate. Each isolation pillar is in an "I" shape, so that a disconnection on the light-emitting function layer 108 is improved. In some embodiments, the first isolation pillar (namely, the first isolation structure $H_1$) and the second isolation pillar (namely, the second isolation structure $H_2$ may be also other shapes (for example, an inverted trapezoid), which is not limited herein.

In some embodiments, the above display substrate provided by the embodiment of the present disclosure, as shown in FIG. 1 to FIG. 5, may further include: a bridging layer on one side of the second protection layer 106 away from the base substrate 101. The bridging layer includes a floating electrode 111, and an orthographic projection of the floating electrode 111 on the base substrate 101 covers at least a part of the orthographic projection of the second isolation structure $H_2$ on the base substrate 101.

The floating electrode 111 may cover the encapsulation layer 103 at the second isolation structure $H_2$ to prevent the encapsulation layer 103 from peeling. Meanwhile, a grooving area of the blocking wall 102 is covered with the floating electrode 111, so that flatness of this position is improved, and a second insulating layer (TLD) 112 is prevented from wrinkling and cracking. Besides, the floating electrode 111 may further block light emitted by a light-emitting device 102 in the display area AA from irradiating the holing area HA, and to prevent the light emitted by the light-emitting device 102 from affecting photographing.

In some embodiments, as shown in FIG. 1 to FIG. 5, the floating electrode 111 is provided with a closed-loop shape, and an orthographic projection of the floating electrode 111 on the base substrate 101 completely covers orthographic projections of all the second isolation structures $H_2$ on the base substrate 101.

In some embodiments, materials of the first protection layer 104 and the second protection layer 106 are the same as a material of the etching blocking layer 110. In some embodiments, the materials of the first protection layer 104, the second protection layer 106 and the etching blocking layer 110 may be silicon nitride, silicon oxide, silicon oxynitride, etc.

In some embodiments, in the above display substrate provided by the embodiment of the present disclosure, as shown in FIG. 2, a distance between a surface of the filling layer 105 away from the base substrate 101 and the base substrate 101 is larger than a distance between a surface of the encapsulation layer 103 away from the base substrate 101 and the base substrate 101. In this way, a film layer around the holing area HA is thicker, so a shape of the holing area HA is better maintained.

Figure 10:
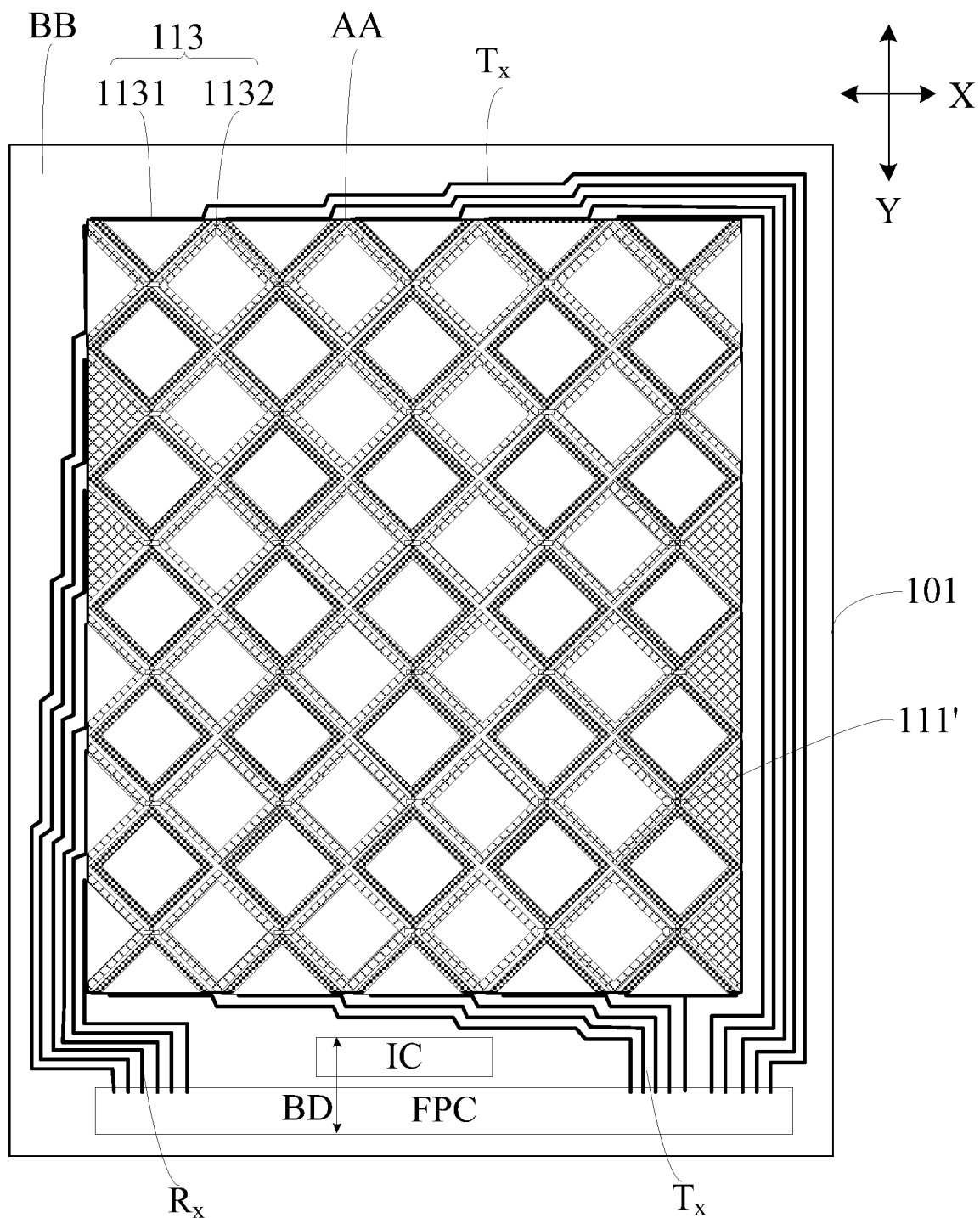
FIG. 10 is yet another schematic structural diagram of a display substrate provided by an embodiment of the present disclosure.

In some embodiments, the above display substrate provided by the embodiment of the present disclosure, as shown in FIG. 9 and FIG. 10, may further include: a second inorganic insulation layer 112 and a touch electrode layer 113 sequentially on one side of the bridging layer 111 away from the base substrate 101. The bridging layer 111 further includes a plurality of bridging electrodes 111' in the display area AA. The touch electrode layer 113 includes, in the display area AA, a plurality of first touch electrodes 1131 extending in a first direction Y, and a plurality of second touch electrodes 1132 extending in a second direction X. The first touch electrodes 1131 and the second touch electrodes 1132 are provided with a grid shape, the plurality of second touch electrodes 1132 or the plurality of first touch electrodes 1131 are electrically connected to the plurality of bridging electrodes 111' through an opening penetrating through the second inorganic insulation layer 112, and the first direction Y intersects the second direction X. In this way, a touch module (TSP) externally added is not needed, so a screen thickness may be reduced, thus folding is facilitated, meanwhile, there is no attachment tolerance, and a bezel width may be reduced.

Besides, in order to provide an effective signal for the touch electrode layer 113, a plurality of signal lines $T_x$ and $R_x$ electrically connected to the touch electrode layer 113 may be arranged in a bezel area BB around the display area AA. In some embodiments, the signal lines $T_x$ and $R_x$ each may be distributed on both the bridging layer 111 and the touch electrode layer 113, and double-layer distribution of the same signal line $T_x$ or $R_x$ realizes electrically connection through the opening penetrating through the second inorganic insulation layer 112. Resistances of the signal lines $T_x$ and $R_x$ in double-layer distribution design are small, and signal delay (RC delay) is greatly reduced.

In some embodiments, the above display substrate provided by the embodiment of the present disclosure, as shown in FIG. 2 to FIG. 5 and FIG. 9, may further include: a third protection layer 114 on one side of the touch electrode layer 113 away from the base substrate 101, and the third protection layer 114 is in the display area AA and the isolation area QA. Optionally, in FIG. 4 and FIG. 5, in order to meet an assembling demand of a camera module, a portion of the third protection layer 114 in a dotted line M (namely, on one side away from the display area AA) may be removed after the process is completed. A material of the third protection layer 114 may be organic (OC) insulating cement.

In general, as shown in FIG. 9, the above display substrate provided by the embodiment of the present disclosure, may further include: a flat layer 102', a pixel defining layer 115, a supporting layer 116, an anode 117, a cathode 118, a flexible printed circuit (FPC) bonded to the signal lines $T_x$ and $R_x$, and a driving chip, such as an integrated circuit (IC) bonded to the signal lines such as a data line of the display area AA. Other essential components of the display substrate should be understood by those ordinarily skilled in the art and will be neither described in detail herein, nor used to limit the present disclosure. In some embodiments, the blocking wall 102 may be in the same layer and have the same material as at least one film layer among the flat layer 102', the pixel defining layer 115 and the supporting layer 116.

Besides, it needs to be noted that the present disclosure makes a description by taking the light-emitting device being of a top emitting type, and the TFT being of a top gate type for examples. During specific implementation, the light-emitting device may be also a bottom emitting type, and the TFT may be also a bottom gate type, which is not limited herein.

Besides, specific to the above display substrate provided by the present disclosure, a corresponding method is further provided and includes the following steps.

A base substrate is provided, wherein the base substrate includes a holing area, a display area around the holing area, and an isolation area between the display area and the holing area, and the holing area is configured to install a light extraction component.

At least one circle of blocking wall is formed on the base substrate, wherein the at least one circle of blocking wall in the isolation area is around the holing area.

An encapsulation layer is formed on a layer where the at least one circle of blocking wall is located, wherein an orthographic projection of the encapsulation layer on the base substrate completely covers the display area.

A first protection layer is formed on the encapsulation layer, wherein the first protection layer at least completely covers the at least one circle of blocking wall.

A filling layer is formed on the first protection layer, wherein the filling layer is in the isolation area, completely covers the at least one circle of blocking wall and at least overlaps with the encapsulation layer.

Taking the display substrate shown in FIG. 2 for example, a manufacture process is as follows.

Figure 11:
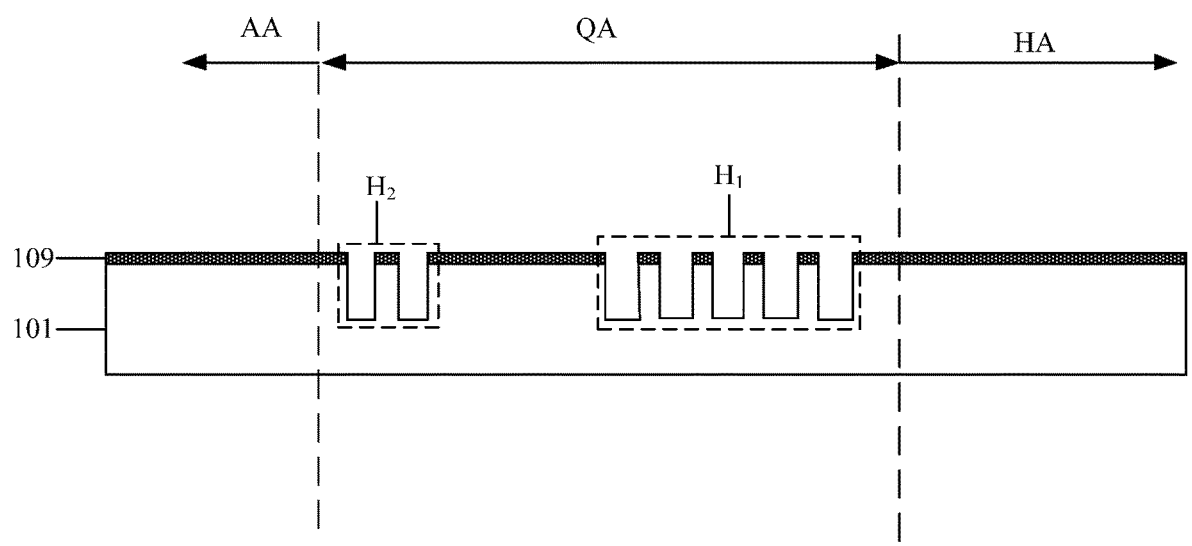
FIG. 11 to FIG. 30 are schematic structural diagrams in a manufacture process of the display substrate shown in FIG. 2 respectively.
Figure 12:
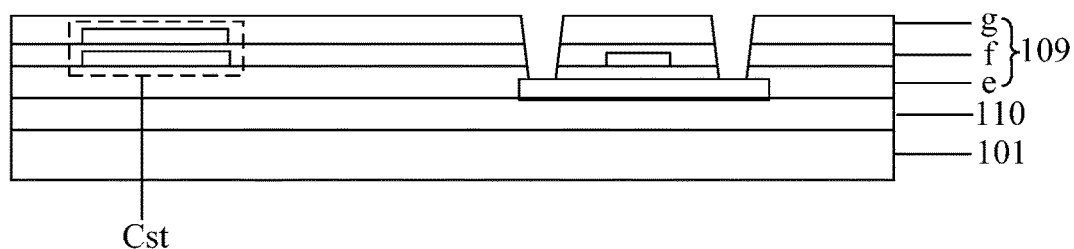

First step, as shown in FIG. 11 and FIG. 12, an active layer and a gate of a TFT contained in a pixel driving circuit, a first electrode and a second electrode of a storage capacitor Cst, an etching blocking layer 110, a gate insulation layer e, a first interlayer dielectric layer f and a second interlayer dielectric layer g are formed on the base substrate 101. The gate insulation layer e, the first interlayer dielectric layer f and the second interlayer dielectric layer g form an isolation layer 109 (namely, a first inorganic insulation layer), the isolation layer 109 (namely, the first inorganic insulation layer) is provided with a plurality of first isolation grooves $H_1$ and a plurality of second isolation grooves $H_2$ in the isolation area QA, and is provided with a contact hole in the display area AA, and the contact hole is used for electrically connecting the active layer of the TFT with a source/drain electrode of the TFT. Besides, a blind hole directly opposite to the first isolation groove (namely, a first isolation structure $H_1$) and the second isolation groove (namely, a second isolation structure $H_2$) is formed in the base substrate 101.

Figure 13:
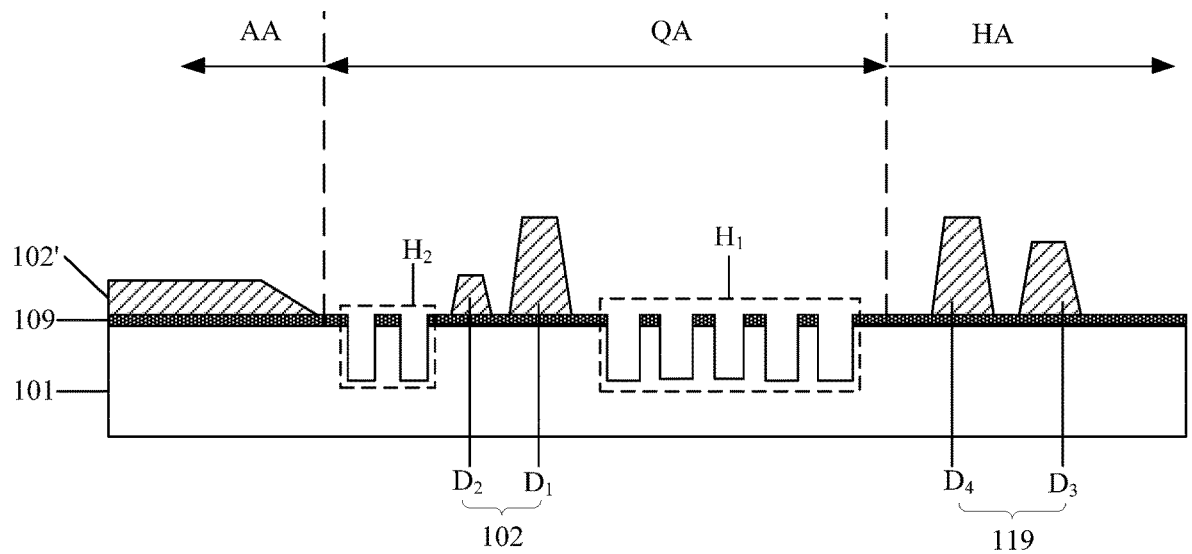
Figure 14:
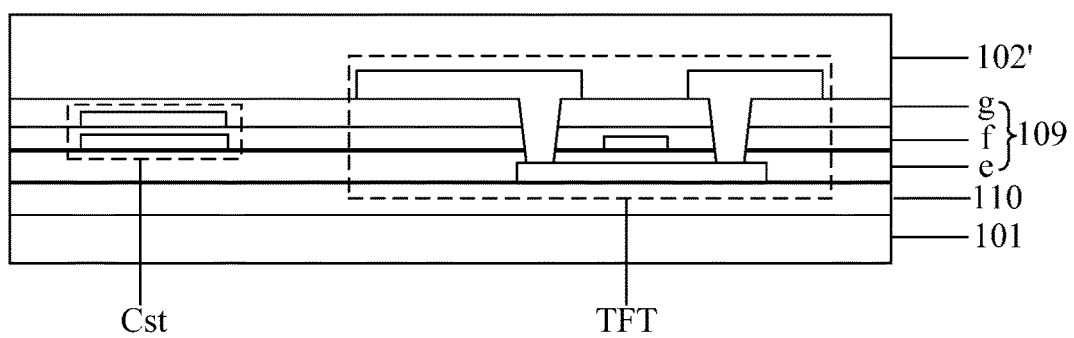

Second step, as shown in FIG. 13 and FIG. 14, the source/drain electrode of the TFT, a flat layer 102', a first blocking wall $D_1$, a second blocking wall $D_2$, a first blocking dam $D_3$ and a second blocking dam $D_4$ are formed on the isolation layer 109 (namely, the first inorganic insulation layer). The first blocking wall $D_1$ and the second blocking wall $D_2$ form the blocking wall 102 in the isolation area QA, and the first blocking dam $D_3$ and the second blocking dam $D_4$ form a blocking dam 119 in the holing area HA. The first blocking wall $D_1$, the second blocking wall $D_2$, the first blocking dam $D_3$ and the second blocking dam $D_4$ may be in the same layer and have the same material as the flat layer 102'. The first blocking wall $D_1$ and the second blocking wall $D_2$ may prevent an organic encapsulation layer b subsequently formed in the display area AA from passing the first blocking wall $D_1$, so that a good encapsulation is guaranteed. A reinforced pad 107 with the same material as the organic encapsulation layer b will be formed in a center of the holing area HA subsequently, the first blocking dam $D_3$ and the second blocking dam $D_4$ may prevent the reinforced pad 107 from passing the second blocking dam $D_4$ and overflowing to the isolation area QA, so water vapor is effectively prevented from extending to the display area AA along a material of the overflowing reinforced pad 107.

Figure 15:
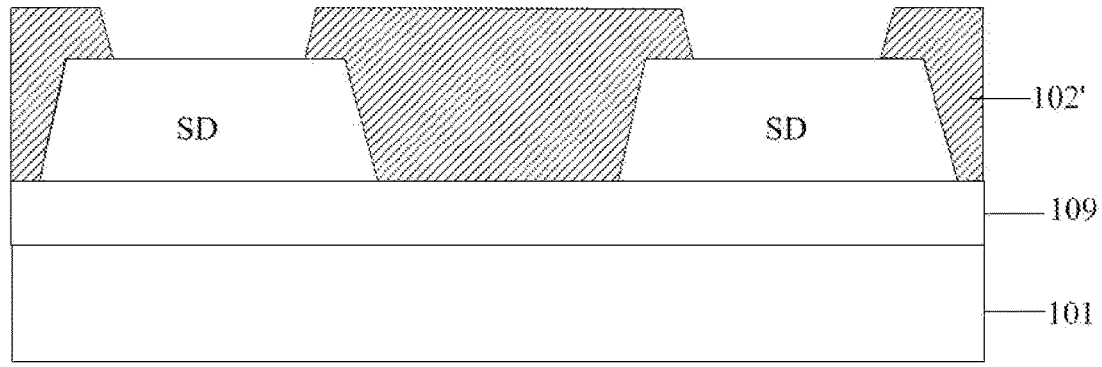

Besides, as shown in FIG. 15, a bonding area BD of a driving chip IC is provided with data lines SD in the same layer and with the same material as the source/drain electrode of the TFT. The flat layer 102' made of an organic material is between the adjacent data lines SD, and thus the adjacent data lines SD are insulated with each other through the flat layer 102'.

In some embodiments, as shown in FIG. 13, in a direction perpendicular to the base substrate 101, a thickness of the first blocking dam $D_3$ is smaller than a thickness of the second blocking dam $D_4$, so in a direction pointing to the second blocking dam $D_4$ from the first blocking dam $D_3$, a dam from low to high is formed, and a blocking on the reinforced pad 107 is improved. In some embodiments, a thickness of the first blocking dam $D_3$ may be equal to the thickness of the second blocking dam $D_4$. Besides, a thickness of the first blocking wall $D_1$ is larger than a thickness of the second blocking wall $D_2$, so in a direction pointing to the first blocking wall $D_1$ from the second blocking wall $D_2$, a dam from low to high is formed, so that a blocking on the organic encapsulation layer b is improved. In some embodiments, the thickness of the first blocking wall $D_1$ may be equal to the thickness of the second blocking dam $D_4$.

Figure 16:
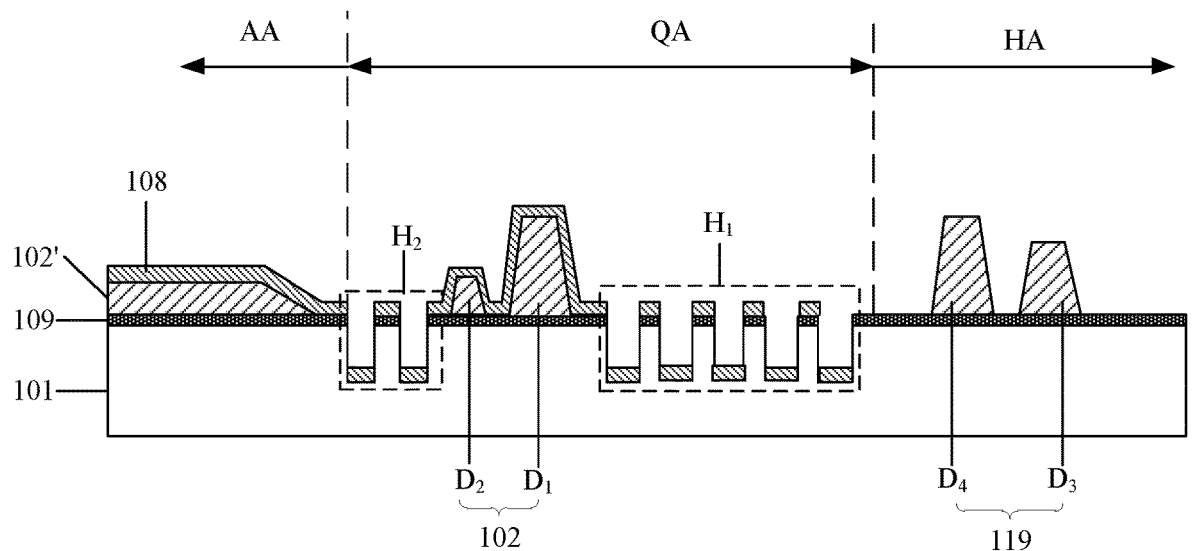
Figure 17:
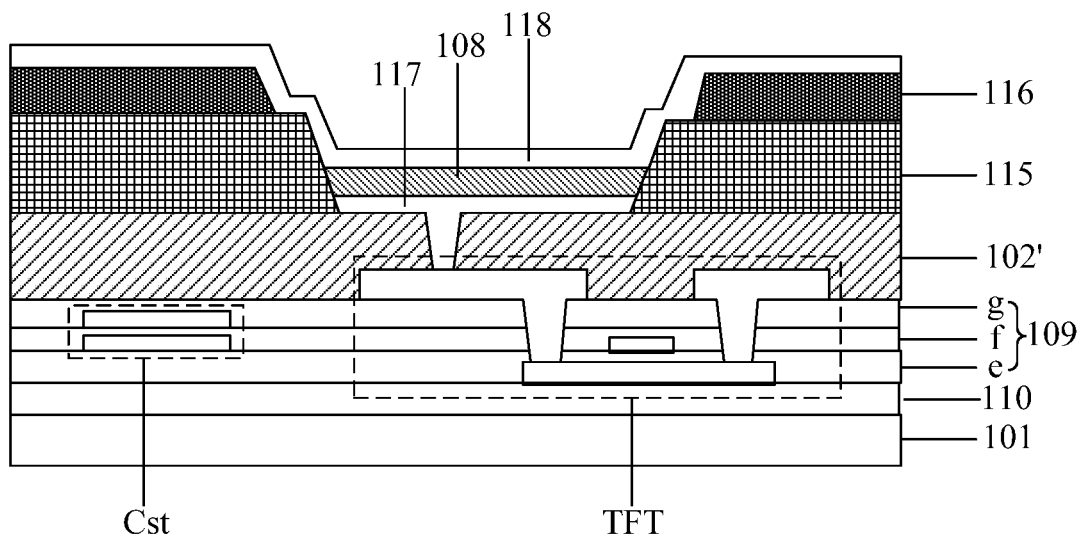

Third step, as shown in FIG. 16 and FIG. 17, an anode 117, a pixel defining layer 115, a light-emitting function layer 108, a spacer layer 116 and a cathode 118 are formed on the flat layer 102', a portion of the light-emitting function layer 108 in the holing area HA is removed during manufacture of the light-emitting function layer 108, and the light-emitting function layer 108 is broken at the first isolation groove (namely, the first isolation structure $H_1$) and the second isolation groove (namely, the second isolation structure $H_2$) due to existence of the first isolation groove (namely, the first isolation structure $H_1$) and the second isolation groove (namely, the second isolation structure $H_2$).

Figure 18:
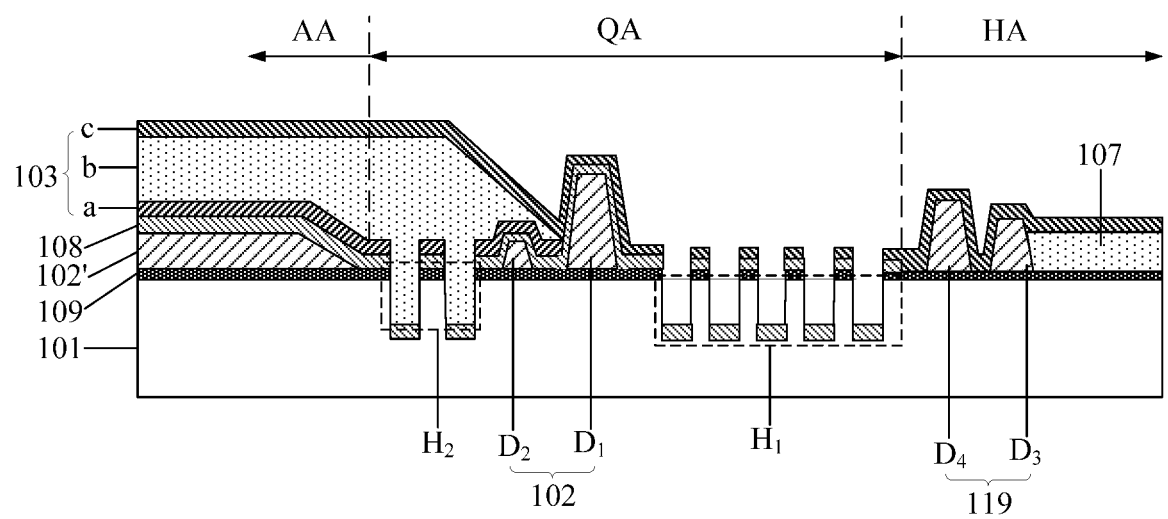
Figure 19:
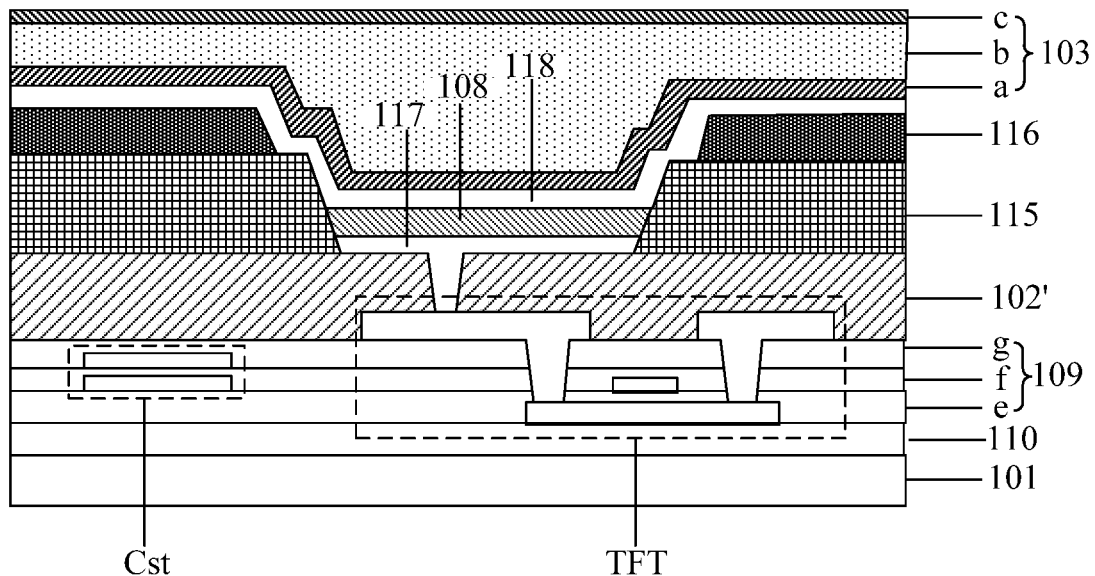

Fourth step, as shown in FIG. 18 and FIG. 19, a first inorganic encapsulation layer a, the organic encapsulation layer b and a second inorganic encapsulation layer c are formed on the cathode 118 in sequence, and the reinforced pad 107 in the same layer and with the same material as the organic encapsulation layer b is formed in the holing area HA. The first inorganic encapsulation layer a, the organic encapsulation layer b and the second inorganic encapsulation layer c arranged in stack form the encapsulation layer 103. The first inorganic encapsulation layer a is in the display area AA and in the isolation area QA between the second blocking wall $D_2$ and the display area AA, and the second inorganic encapsulation layer c is in the display area AA, the isolation area QA and the holing area HA. The first inorganic encapsulation layer a is provided with an opening at the second isolation groove (namely, the second isolation structure $H_2$), and the second inorganic encapsulation layer c is provided with an opening at the first isolation groove (namely, the first isolation structure $H_1$). The reinforced pad 107 is configured to reduce the segment difference between film layers in the display area AA and the holing area HA so as to prevent a touch function layer from peeling subsequently.

Figure 20:
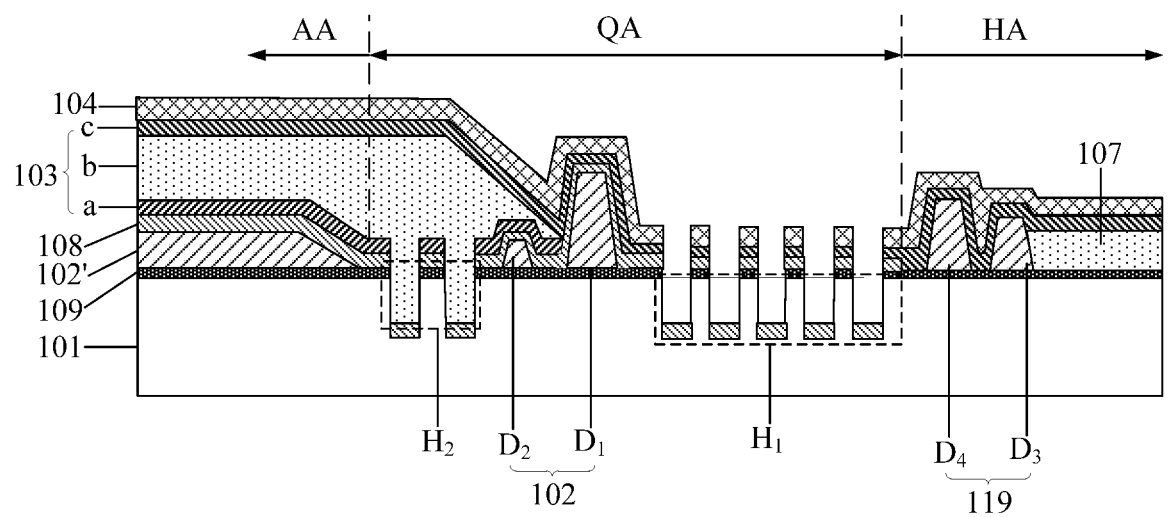
Figure 21:
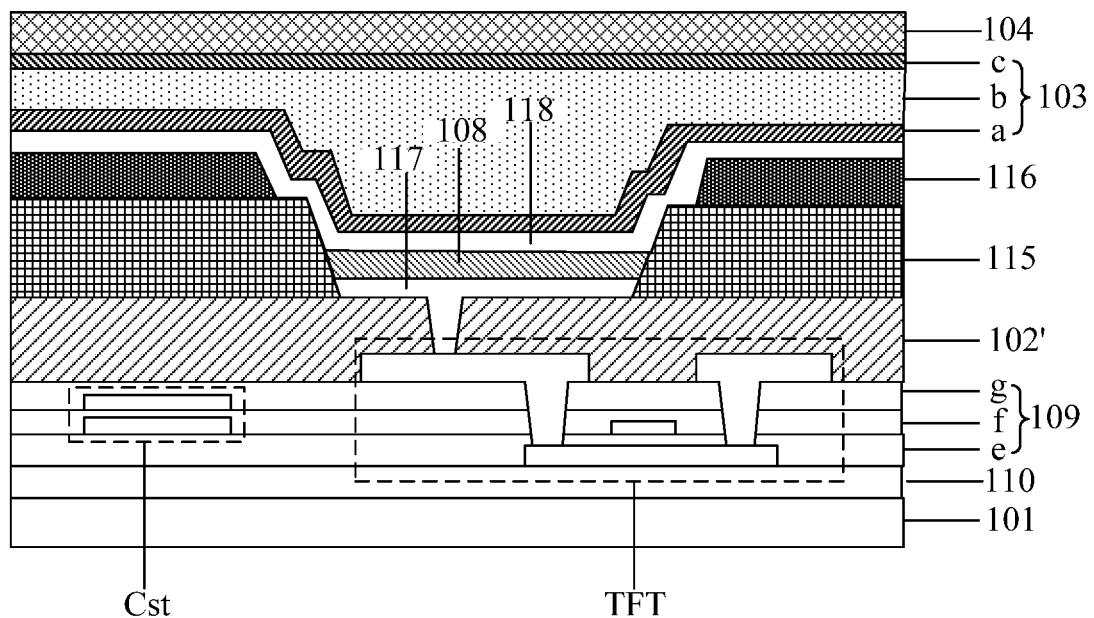
Figure 22:
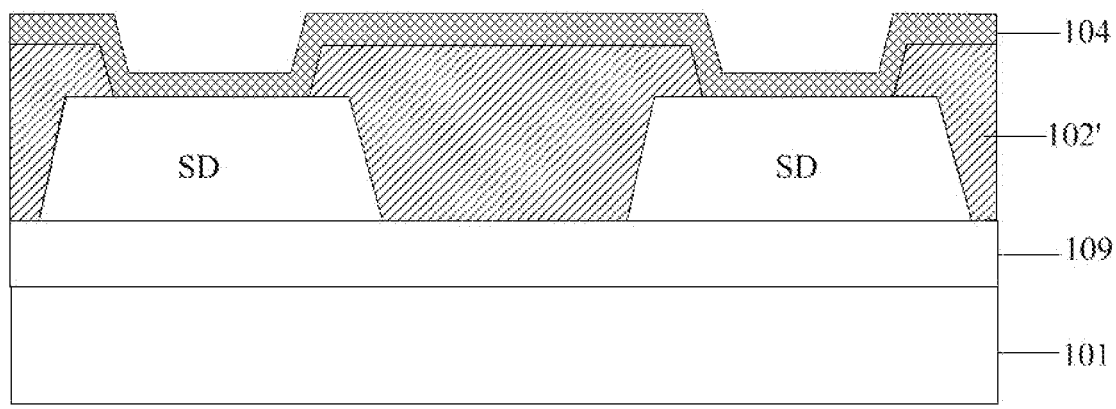

Fifth step, as shown in FIG. 20 to FIG. 22, an inorganic material layer is formed on a whole surface of the encapsulation layer 103, the inorganic material layer is patterned to form the first protection layer 104, and the first protection layer 104 is provided with an opening only in the isolation area QA. In the isolation area QA, the opening of the first protection layer 104 communicates with the opening of the second inorganic encapsulation layer, and the opening of the first protection layer 104 directly faces the first isolation groove (namely, the first isolation structure $H_1$). It may be seen from FIG. 23 that though the flat layer 102' made of an organic material is not covered with the first inorganic encapsulation layer a and the second inorganic encapsulation layer c, the first protection layer 104 completely covers interior of the bonding area BD, so that the flat layer 102' in the bonding area BD is separated from the filling layer 105 manufactured subsequently, and the flat layer 102' is prevented from absorbing water vapor during manufacture of the filling layer 105. Thus a situation that water vapor evaporation exits under a high temperature condition of a reliability test, and consequently peeling of a subsequent touch layer is caused is avoided.

Figure 23:
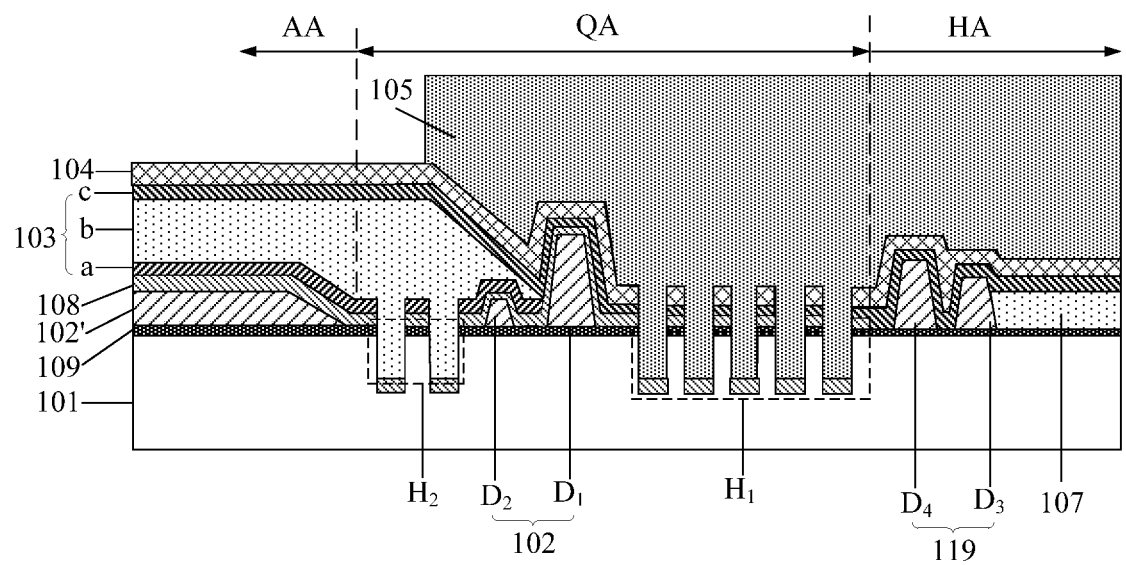
Figure 24:
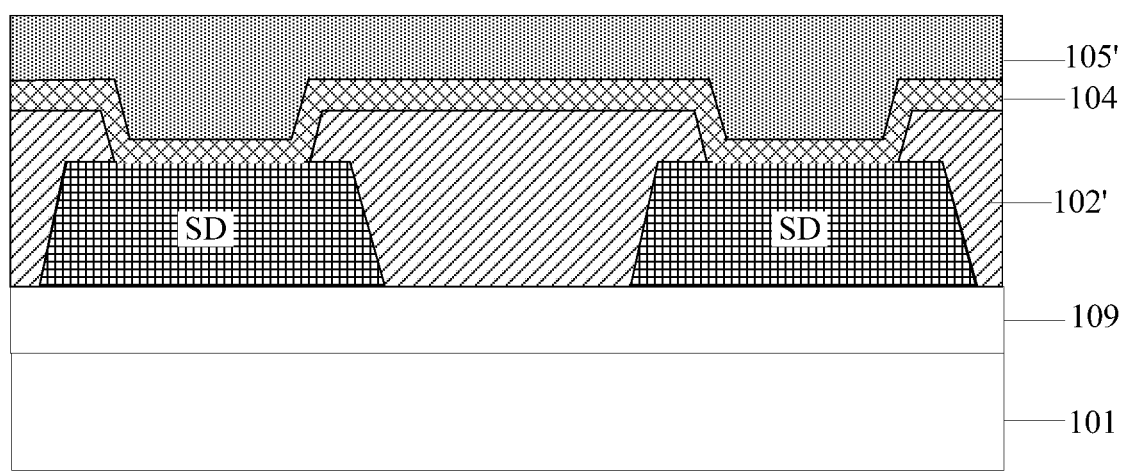
Figure 25:
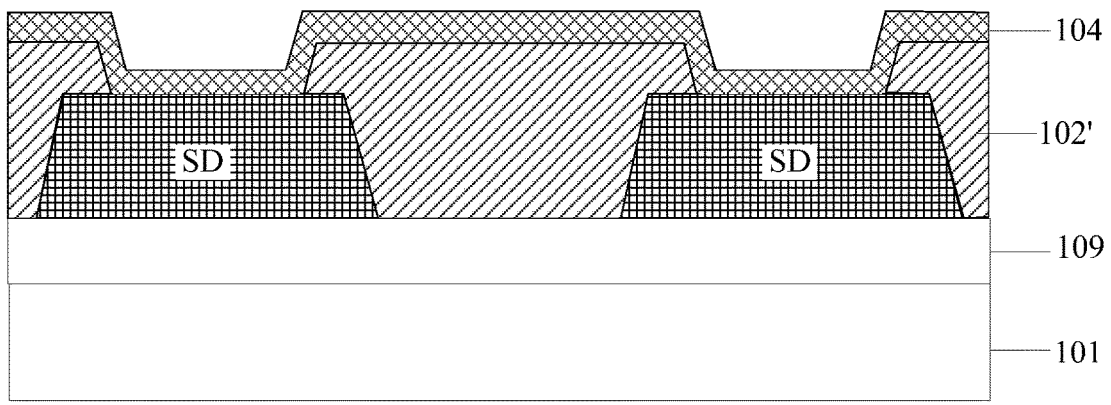

Sixth step, as shown in FIG. 23 to FIG. 25, an organic insulating layer 105' is formed on a whole surface of the first protection layer 104, the organic insulation layer 105' is patterned to form the filling layer 105, and the filling layer 105 is in the holing area HA and the isolation area QA.

Figure 26:
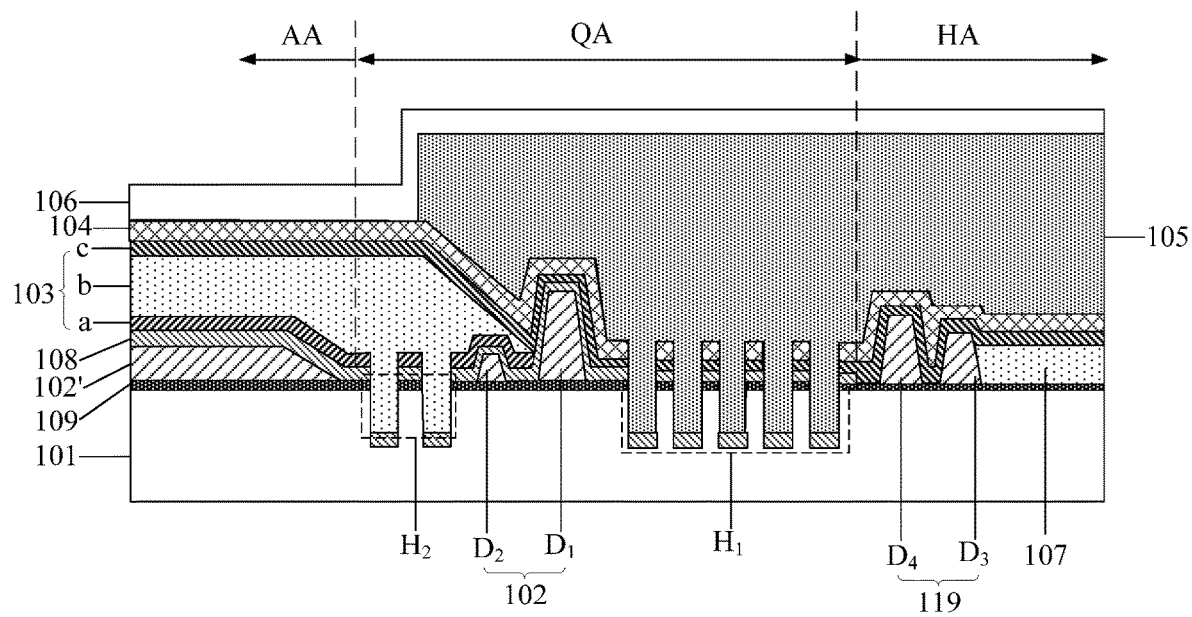
Figure 27:
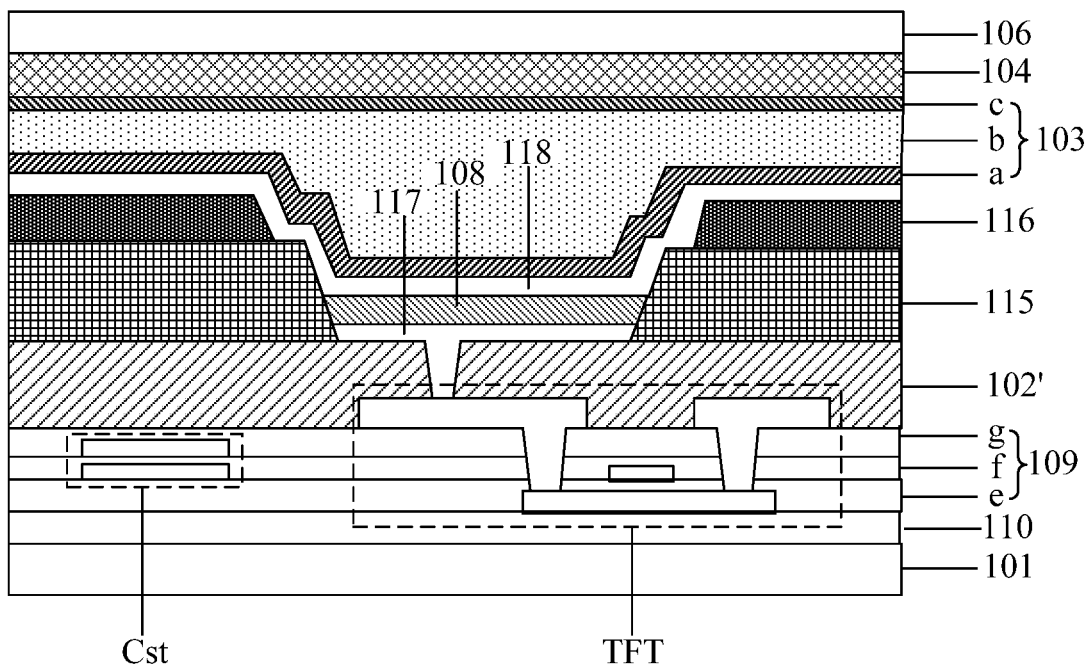
Figure 28:
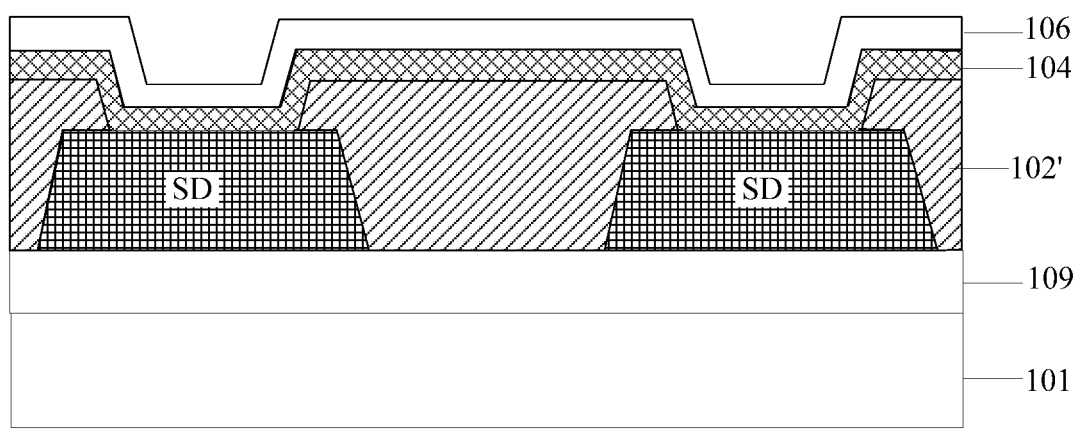
Figure 29:
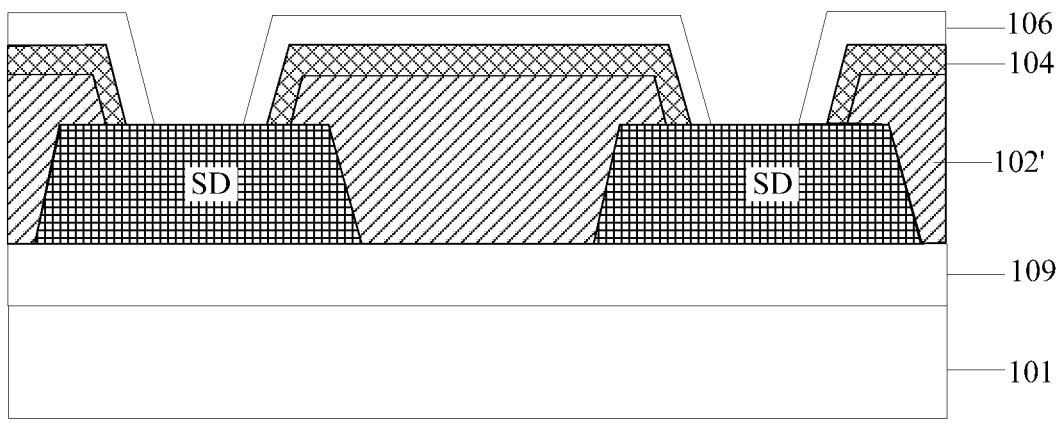

Seventh step, as shown in FIG. 26 to FIG. 28, the second protection layer 106 arranged in a whole surface is formed on the filling layer 105. Then, as shown in FIG. 29, a through opening is formed in the first protection layer 104 and the second protection layer 106 above the data line SD so as to expose the data line SD, and thus subsequent bonding connection between the data line SD and the driving chip IC is convenient.

Figure 30:
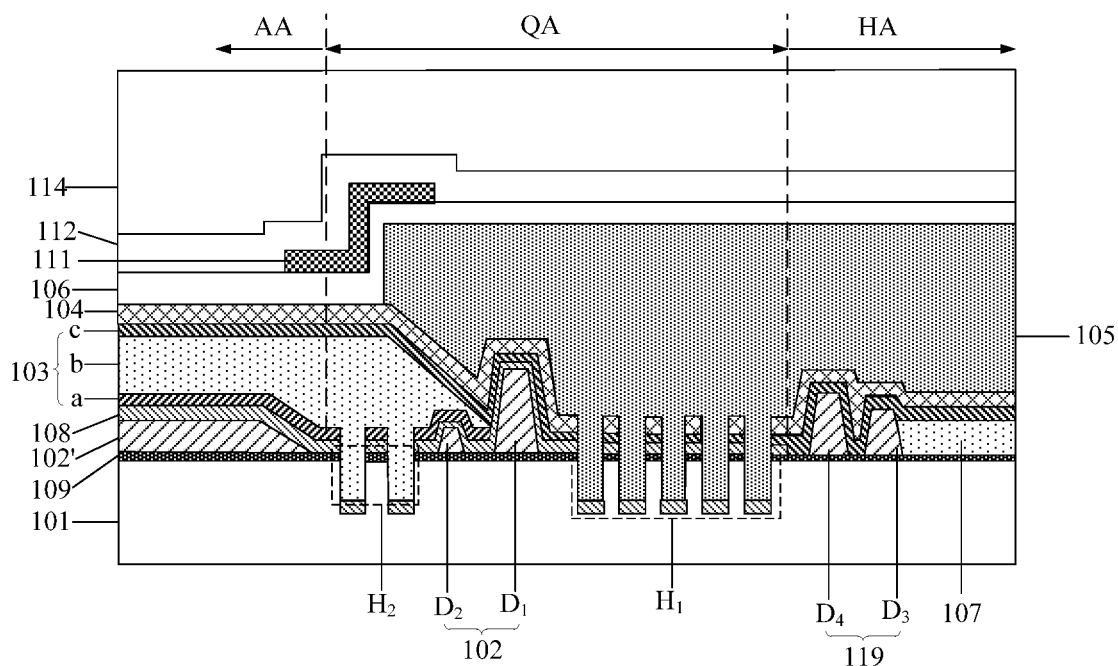

Eighth step, as shown in FIG. 30, FIG. 9 and FIG. 10, a bridging layer, a second inorganic insulation layer 112, a touch electrode layer 113 and a third protection layer 114 arranged in a whole surface are formed on the second protection layer 106 in sequence. The bridging layer includes a plurality of bridging electrodes 111' in the display area AA, and a floating electrode 111 covering the second isolation groove (namely, the second isolation structure $H_2$). The touch electrode layer 113 includes, in the display area AA, a plurality of first touch electrodes 1131 extending in a first direction Y and a plurality of second touch electrodes 1132 extending in a second direction X. The plurality of second touch electrodes 1132 or the plurality of first touch electrodes 1131 are electrically connected to the plurality of bridging electrodes 111' through an opening penetrating through the second inorganic insulation layer 112, and the first direction Y intersects the second direction X. A plurality of signal lines $T_x$ and $R_x$ electrically connected to the touch electrode layer 113 are in a bezel area BB around the display area AA. Moreover, the signal lines $T_x$ and $R_x$ each are distributed on both the bridging layer 111 and the touch electrode layer 113, and double-layer distribution of the same signal line $T_x$ or $R_x$ realizes electrically connection through the opening penetrating through the second inorganic insulation layer 112.

Ninth step, as shown in FIG. 1 and FIG. 2, all the film layers such as the base substrate 101, the isolation layer 109 (namely, the first inorganic insulation layer), the first blocking dam $D_3$, the second blocking dam $D_4$, the reinforced pad 107, the first inorganic insulation layer a, the first protection layer 104, the filling layer 105, the second protection layer 106, the second inorganic insulation layer 112 and the third protection layer 114 in the holing area HA are removed once in laser cutting, so that a through hole is formed in the holing area HA, so a camera module may be installed conveniently, and high light transmittance of the holing area HA may be guaranteed.

So far, manufacture of the display substrate shown in FIG. 2 provided by the embodiment of the present disclosure is completed.

Based on the same inventive concept, the present disclosure further provides a display apparatus, including the above display substrate provided by the embodiment of the present disclosure and a light extraction component. The light extraction component is installed in a holing area of the display substrate. In some embodiments, the display substrate may be an organic light-emitting diode (OLED) display substrate, and the light extraction component may be the camera module. A principle of solving problems of the display apparatus is similar to a principle of solving problems of the above display substrate, so implementation of the display apparatus may refer to the embodiment of the above display substrate, and repetition is not described in detail.

In some embodiments, the above display apparatus provided by the embodiment of the present disclosure may be: a mobile phone, a tablet computer, a TV, a display, a notebook computer, a digital photo frame, a navigator, a smartwatch, a fitness wristband, a personal digital assistant and any other product or component with a display function. The display apparatus provided by the embodiment of the present disclosure may include but is not limited to: a radio frequency unit, a network module, an audio output unit, an input unit, a sensor, a display unit, a user input unit, a port unit, a memory, a processor, a power source and other components. Those skilled in the art may understand that constitution of the above display apparatus does not limit the display apparatus, and the display apparatus may include more or less components above, or combination of some components, or arrangement of different components.

Though the preferred embodiments of the present disclosure are already described, those skilled in the art may make extra changes and modifications to these embodiments once they know a basic inventive concept. Therefore, appended claims intended to be constructed as including the preferred embodiments and all the changes and modifications falling within the scope of the present disclosure.

Apparently, those skilled in the art may make various changes and transformations to the embodiments of the present disclosure without departing from the spirit and scope of the embodiments of the present disclosure. In this case, if these changes and transformations of the embodiments of the present disclosure fall within the scope of claims and their equivalents of the present disclosure, the present disclosure also intends to contain these changes and transformations.

What is claimed is:

1. A display substrate, comprising:
   a base substrate, comprising a holing area, a display area around the holing area, and an isolation area between the display area and the holing area, wherein the holing area is configured to install a light extraction component;
   one or more circles of blocking wall, in the isolation area and around the holing area;
   an encapsulation layer, on one side of a layer where the one or more circles of blocking wall are located away from the base substrate, wherein an orthographic projection of the encapsulation layer on the base substrate completely covers the display area;
   a first protection layer, on one side of the encapsulation layer away from the base substrate and at least completely covering the one or more circles of blocking wall;

a filling layer, on one side of the first protection layer away from the base substrate, in the isolation area, completely covering the one or more circles of blocking wall and at least partially overlapping with the encapsulation layer; and a second protection layer, on one side of the filling layer away from the base substrate, wherein the second protection layer at least completely covers the filling layer, and the second protection layer on the filling layer is gradually inclined to a side of the base substrate in a direction from one side of the second protection layer close to the display area to another side of the second protection layer away from the display area.

2. The display substrate according to claim 1, wherein the encapsulation layer comprises an organic encapsulation layer, the organic encapsulation layer comprises a first organic encapsulation portion in the display area and a second organic encapsulation portion in the isolation area, a thickness h of the first organic encapsulation portion in a direction perpendicular to the base substrate meets the following formula: h=0.017x+4.5, in a condition that x≤441 microns; and h=12 microns, in a condition that x>441 microns, wherein x is a distance between a measured position and a reference point, and the reference point is a point of one side, closest to the display area, of the one or more circles of blocking wall; and the second organic encapsulation portion is completely covered with the filling layer, a thickness of the second organic encapsulation portion in the direction perpendicular to the base substrate is gradually reduced in a direction from one side, close to the display area, of the second organic encapsulation portion to another side, away from the display area, of the second organic encapsulation portion.

3. The display substrate according to claim 2, wherein the one or more circles of blocking wall comprise a first blocking wall away from the display area and a second blocking wall close to the display area, the second organic encapsulation portion covers the second blocking wall, a maximum width of the second blocking wall in a direction from one side, close to the display area, to another side away from the display area, of the second blocking wall is A, and a maximum width of a covering portion, covering the second blocking wall, of the second organic encapsulation portion in the direction from one side, close to the display area, to another side away from the display area, of the second blocking wall is B, wherein B≤0.85 A.

4. The display substrate according to claim 3, wherein a segment, a thickness of which does not change, exists on a portion of the filling layer covering the second blocking wall, in the direction perpendicular to the base substrate is C.

5. The display substrate according to claim 3, wherein the thickness of the filling layer is gradually increased to D in the direction from one side, close to the display area, of the second blocking wall, to another side, away from the display area, of the second blocking wall starting from the segment the thickness of which does not change, and a ratio of D to C is in a range from 2.5 to 3.

6. The display substrate according to claim 3, wherein a distance from the first blocking wall to the display area is smaller than a distance from the first blocking wall to the holing area.

7. The display substrate according to claim 1, wherein the first protection layer further comprises a film layer which at least partially covers the display area, and is provided with a first opening corresponding to the holing area;

the second protection layer further comprises a film layer which at least covers a part of the display area, and is provided with a second opening corresponding to the holing area.

8. The display substrate according to claim 7, wherein the encapsulation layer further comprises a first inorganic encapsulation layer between an organic encapsulation layer and the one or more circles of blocking wall, and a second inorganic encapsulation layer between the organic encapsulation layer and the first protection layer;

wherein an orthographic projection of the first inorganic encapsulation layer on the base substrate substantially coincides with an orthographic projection of the second inorganic encapsulation layer on the base substrate, and the second inorganic encapsulation layer wraps the organic encapsulation layer.

9. The display substrate according to claim 7, wherein the filling layer is provided with a fourth opening corresponding to the holing area.

10. The display substrate according to claim 8, wherein the second inorganic encapsulation layer further comprises a film layer which at least covers a part of the display area, and is provided with a third opening corresponding to the holing area.

11. The display substrate according to claim 1, further comprising a light-emitting function layer between a layer where the one or more circles of blocking walls are located and the encapsulation layer; wherein the light-emitting function layer is provided with an opening corresponding to the holing area; and an isolation layer between the base substrate and a layer where the one or more circles of blocking wall are located, and the isolation layer comprises at least one circle of first isolation structure and/or at least one circle of second isolation structure;

wherein the at least one circle of first isolation structure is in a portion of the isolation area between the one or more circles of blocking wall and the holing area, and the at least one circle of second isolation structure is in another portion of the isolation area between the one or more circles of blocking wall and the display area; and in the portion of the isolation area between the one or more circles of blocking wall and the holing area, a portion of the light-emitting function layer at the first isolation structure is disconnected from another portion of the light-emitting function layer between first isolation structures; and in the another portion of the isolation area between the one or more circles of blocking wall and the display area, a portion of the light-emitting function layer at the second isolation structure is disconnected from another portion of the light-emitting function layer between second isolation structures.

12. The display substrate according to claim 11, wherein in the portion of the isolation area between the one or more circles of blocking wall and the holing area, the first protection layer is provided with an opening at the first isolation structure or between the first isolation structures; and in another portion of the isolation area between the one or more circles of blocking wall and the display area, the first inorganic encapsulation layer is provided with an opening at the second isolation structure or between the second isolation structures.

13. The display substrate according to claim 11, further comprising: a bridging layer on one side of the second protection layer away from the base substrate, wherein the bridging layer comprises a floating electrode, and an orthographic projection of the floating electrode on the base substrate covers at least a part of an orthographic projection of the second isolation structure on the base substrate.

14. The display substrate according to claim 13, wherein the floating electrode is provided with a closed-loop shape, and an orthographic projection of the floating electrode on the base substrate completely covers an orthographic projection of the at least one circle of second isolation structure on the base substrate.

15. The display substrate according to claim 13, further comprising: a second inorganic insulation layer and a touch electrode layer which are sequentially on one side of the bridging layer away from the base substrate;
wherein the bridging layer further comprises a plurality of bridging electrodes in the display area; and
the touch electrode layer comprises, in the display area, a plurality of first touch electrodes extending in a first direction and a plurality of second touch electrodes extending in a second direction, the plurality of second touch electrodes or the plurality of first touch electrodes are electrically connected to the plurality of bridging electrodes through an opening penetrating through the second inorganic insulation layer, and the first direction intersects the second direction.

16. The display substrate according to claim 15, further comprising: a third protection layer on one side of the touch electrode layer away from the base substrate, wherein the third protection layer is in the display area and the isolation area.

17. A display apparatus, comprising the display substrate according to claim 1 and the light extraction component, wherein the light extraction component is installed in the holing area of the display substrate.

18. A method for manufacturing a display substrate, wherein the display substrate is according to claim 1, and the method comprises:

providing the base substrate, wherein the base substrate comprises the holing area, the display area around the holing area, and the isolation area between the display area and the holing area, and the holing area is configured to install the light extraction component;
forming one or more circles of blocking wall on the base substrate, wherein the one or more circles of blocking wall in the isolation area are around the holing area;
forming the encapsulation layer on the layer where the one or more circles of blocking wall are located, wherein the orthographic projection of the encapsulation layer on the base substrate completely covers the display area;
forming the first protection layer on the encapsulation layer, wherein the first protection layer at least completely covers the one or more circles of blocking wall; and
forming the filling layer on the first protection layer, wherein the filling layer is in the isolation area, completely covers the one or more circles of blocking wall and at least partially overlaps with the encapsulation layer.

19. The display substrate according to claim 1, further comprising: an etching blocking layer on one side of the base substrate facing the at least one circle of blocking wall, wherein the etching blocking layer makes direct contact with the base substrate; and
the materials of the first protection layer and the second protection layer are the same as a material of the etching blocking layer.

20. The display substrate according to claim 1, wherein a distance between a surface of the filling layer away from the base substrate and the base substrate is larger than a distance between a surface of the encapsulation layer away from the base substrate and the base substrate.

* * * * *